US007983858B2

(12) United States Patent
Takamatsu et al.

(10) Patent No.: US 7,983,858 B2
(45) Date of Patent: Jul. 19, 2011

(54) FAULT TEST APPARATUS AND METHOD FOR TESTING SEMICONDUCTOR DEVICE UNDER TEST USING FAULT EXCITATION FUNCTION

(75) Inventors: Yuzo Takamatsu, Ehime (JP); Hiroshi Takahashi, Ehime (JP); Yoshinobu Higami, Ehime (JP); Michinobu Nakao, Tokyo (JP); Takashi Aikyo, Kanagawa (JP); Michiaki Emori, Kanagawa (JP); Hideo Ohmae, Kanagawa (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 434 days.

(21) Appl. No.: 12/222,992

(22) Filed: Aug. 21, 2008

(65) Prior Publication Data

US 2009/0063062 A1    Mar. 5, 2009

(30) Foreign Application Priority Data

Aug. 22, 2007 (JP) ................................. 2007-216141

(51) Int. Cl.
*G06F 19/00* (2011.01)
(52) U.S. Cl. .......................................... 702/58; 714/25
(58) Field of Classification Search .................... 702/85, 702/117, 118, 182–185; 714/25
See application file for complete search history.

(56) References Cited

U.S. PATENT DOCUMENTS

| 6,205,559 | B1 | 3/2001 | Sakaguchi | |
|---|---|---|---|---|
| 6,836,856 | B2 | 12/2004 | Blanton | |
| 2004/0205436 | A1* | 10/2004 | Kundu et al. | 714/741 |
| 2007/0234161 | A1* | 10/2007 | Blanton et al. | 714/736 |

FOREIGN PATENT DOCUMENTS

| JP | 4-55776 | 2/1992 |
|---|---|---|
| JP | 4-62487 | 2/1992 |
| JP | 6-194418 | 7/1994 |
| JP | 6-259500 | 9/1994 |
| JP | 8-180095 | 7/1996 |
| JP | 8-304513 | 11/1996 |
| JP | 10-312406 | 11/1998 |

(Continued)

OTHER PUBLICATIONS

W. Chen et al. "*Analytic Models for Crosstalk Delay and Pulse Analysis Under Non-Ideal Inputs*", Proceedings of IEEE ITC, pp. 809-818, 1997.

(Continued)

*Primary Examiner* — Edward Raymond
(74) *Attorney, Agent, or Firm* — Wenderoth, Lind & Ponack, L.L.P.

(57) ABSTRACT

A fault test apparatus for testing a fault on each signal line in a circuit under test including signal lines includes a controller, which calculates a value of a fault excitation function for a fault signal line, using the fault excitation function representing a fitness result of a predetermined fault excitation condition between the fault signal line having a fault among the signal lines under test in the circuit under test and at least one of adjacent signal lines adjacent to the fault signal line and falling within a predetermined range from the fault signal line, based on layout information between the fault signal line and at least one adjacent signal line adjacent to the fault signal line, manufacturing parameter information, and timing information, and then, determines whether or not a dynamic fault is excited on the fault signal line based on the value of the fault excitation function.

14 Claims, 16 Drawing Sheets

FOREIGN PATENT DOCUMENTS

| | | |
|---|---|---|
| JP | 2005-140710 | 6/2005 |
| JP | 2006-313133 | 11/2006 |

OTHER PUBLICATIONS

Y. Sato et al., "*A Persistent Diagnostic Technique for Unstable Defects*", Proceedings of IEEE ITC, pp. 242-249, 2002.

Yasuo Sato et al., "*Quality Evaluations of Logic BIST's Pseudo Random Patterns*", Transaction on Electronics, IEICE (Institute of Electronics, Information and Communication Engineers), vol. J87-D-1, No. 1, pp. 35-41, Jan. 2004, together with a partial English translation.

S. Irajpour et al. "*Analyzing Crosstalk in the Presence of Weak Bridge Defects*", Proceedings of IEEE VTS, pp. 395-392, 2003.

R. D. Blanton, et al. "*Universal Test Generation Using Fault Tuples*", Proceedings of ITC, 2000.

R.D. Blanton, et al., "*Fault Tuples in Diagnosis of Deep-Submicron Circuits*", Proceedings of ITC, 2002.

R.D. Blanton, et al. "*Analyzing the Effectiveness of Multiple-Detect Test Sets*", Proceedings of ITC, 2003.

R.D. Blanton, et al., "*Diagnosis of Arbitrary Defects Using Neighborhood Function Extraction*", Proceedings of VTS, 2005.

R.D. Blanton, et al. "*Defect Modeling Using Fault Tuples*", IEEE TCAD, 2006.

R.D. Blanton et al., "A Logic Diagnosis Methodology for Improved Localization and Extraction of Accurate Defect Behavior", Proceedings of ITC, 2006.

R.D. Blanton, et al., "Diagnostic Test Generation for Arbitrary Faults", Proceedings of ITC, 2006.

Hiroshi Ohmura et al., "*Testability Evaluation of Open Faults in Consideration of the Voltage of the Adjacent Lines*", Proceedings of Combination conference of Shikoku branches of Electronics related societies, 10-7, pp. 130, Sep. 2005, together with a partial English translation.

Syuhei Kadooyama et al., "*Open Fault Model with Considering Adjacent Lines and its Fault Diagnosis*", Technical report of IEICE (Institute of Electronics, Information and Communication Engineers), vol. 105, No. 607, pp. 25-30, DC2005-76, Feb. 2006.

Syuhei Kadoyama et al. "*Open faults with considering signal transitions at adjacent lines*", Proceedings of 2006 Joint Conference of Shikoku Chapters of the Institute of Electrical and Electronics Engineers in Japan, vol. 2006, pp. ROMBUN. 10-7, Sep. 12, 2006 with English translation thereof.

\* cited by examiner

Fig. 10 THIRD PREFERRED EMBODIMENT
FAULT TESTER APPARATUS AND TEST GENERATOR APPARATUS 100B

FAULT TEST APPARATUS AND METHOD FOR TESTING SEMICONDUCTOR DEVICE UNDER TEST USING FAULT EXCITATION FUNCTION

BACKGROUND OF THE INVENTION

1. Field of the Invention

The present invention relates to a fault test apparatus and a fault test method for testing using a predetermined fault excitation function whether or not a fault occurs in a circuit under test that is a semiconductor device such as an LSI chip.

2. Related Art

Following recent development of semiconductor microfabrication technique, it has become essential to guarantee product quality and to ensure quick yield. Due to this, it is necessary to guarantee high quality of an entire product (to attain target yield within a product lifetime) and to realize appropriate test cost by analyzing and feeding back a portion of a failure, a cause of the failure, and a statistic behavior of the failure using information obtained from results of a test and a fault diagnosis. In a next-generation chip, such physical failures as scratches or voids due to miniaturization and elongation of wirings, introduction of copper wirings and the like conspicuously appear as a resistive short (bridge fault/short-circuit) between signal lines or as breaking of wirings and vias (open wirings and vias). Those failures or faults are reported to have great influence on the quality and performance of the chip. Fault diagnosis methods and test data generation methods according to prior arts are disclosed in, for example, the following prior art documents:

Patent document 1: Japanese patent laid-open publication No. JP-4-055776-A;

Patent document 2: Japanese patent laid-open publication No. JP-6-194418-A;

Patent document 3: Japanese patent laid-open publication No. JP-10-312406-A;

Patent document 4: Japanese patent laid-open publication No. JP-2006-313133-A;

Patent document 5: U.S. Pat. No. 6,836,856;

Patent document 6: Japanese patent laid-open publication No. JP-8-180095-A;

Patent document 7: Japanese patent laid-open publication No. JP-8-304513-A;

Patent document 8: Japanese patent laid-open publication No. JP-6-259500-A;

Patent document 9: Japanese patent laid-open publication No. JP-2005-140710-A;

Non-patent document 1: W. Chen et al., "Analytic models for crosstalk delay and pulse analysis under non-ideal inputs", Proceedings of IEEE ITC, pp. 809-818, 1997;

Non-patent document 2: Y. Sato et al., "A persistent diagnostic technique for unstable defects", Proceedings of IEEE ITC, pp. 242-249, 2002

Non-patent document 3: Y. Sato et al., "Quality Evaluations of Logic BIST's Pseudo Random Patterns"; Transaction on Electronics, IEICE (Institute of Electronics, Information and Communication Engineers), Vol. 87, D-1, No. 1, pp. 35-41, January 2004;

Non-patent document 4: S. Irajpour et al., "Analyzing crosstalk in the presence of weak bridge defects", Proceedings of IEEE VTS, pp. 385-392, 2003;

Non-patent document 5: R. D. Blanton et al., "Universal test generation using fault tuples", Proceedings of ITC, 2000;

Non-patent document 6: R. D. Blanton et al., "Fault tuples in diagnosis of deep-submicron circuits", Proceedings of ITC, 2002;

Non-patent document 7: R. D. Blanton et al., "Analyzing the Effectiveness of Multiple Detect Test Set", Proceedings of ITC, 2003;

Non-patent document 8: R. D. Blanton et al., "Diagnosis of Arbitrary Defects Using Neighborhood Function Extraction", Proceedings of VTS, 2005;

Non-patent document 9: R. D. Blanton et al., "Defect Modeling Using Fault Tuples", IEEE TCAD, 2006;

Non-patent document 10: R. D. Blanton et al., "A Logic Diagnosis Methodology for Improved Localization Extraction of Accurate Defect behavior", Proceedings of ITC, 2006;

Non-patent document 11: R. D. Blanton et al., "Diagnostic Test Generation for Arbitrary Faults", Proceedings of ITC, 2006.

Non-patent document 12: Hiroshi Oomura et al., "Testability Evaluation of Open Faults in Consideration of the Voltage of the Adjacent Lines", Proceedings of Combination conference of Shikoku branches of Electronics related societies, 10-7, pp. 130, September 2005; and Non-patent document 13: Syuhei Kadoyama et al., "Open fault model with considering adjacent lines and its fault diagnosis", Technical report of IEICE (Institute of Electronics, Information and Communication Engineers), Vol. 105, No. 607, pp. 25-30, DC2005-76, February 2006.

As the micro-fabrication of the semiconductor process proceeds, it is considered that a logic value change in the bridge fault/short-circuit portion or open portion on the signal line of the device under test turns into an instable fault state because of the dynamic interference between a signal line having a fault (referred to as a fault signal line hereinafter) and a signal line adjacent to the fault signal line. The fault test method based on a single stuck-at fault model according to the prior art is considered insufficient due to these causes.

Next, physical failure modeling and fault test methods in relation to the physical failure modeling will be described.

For example, Non-patent document 1 proposes a crosstalk fault model by paying attention to polarities (directions) of signal transitions in two signal lines (a fault signal line and an adjacent signal line) and a timing skew (timing information) indicating a deviation in signal transition timing between the two signal lines. Similarly, Non-patent document 4 proposes a resistive bridge fault model with paying attention to polarities (directions) of signal transitions in two signal lines (a fault signal line and an adjacent signal line) and a timing skew indicating the deviation in signal transition timing between the two signal lines.

Non-patent document 2 proposes a method of diagnosing an open fault with paying attention to a signal line having the open fault and a signal line adjacent to the fault signal line. In addition, Non-patent document 3 evaluates a random pattern detection capability with respect to open faults.

Moreover, Blanton et al. propose physical fault modeling as well as test generation methods and fault diagnosis methods using the physical fault models as disclosed in Non-patent documents 5, 7 to 11 and Patent document 5. The fault form of each of the fault models proposed by Blanton et al. is expressed by fault tuples constituted by three components including a signal line number, a normal value or a fault value of the signal line, and a test number. Further, Blanton et al. propose a model constituting fault tuples including a fault signal line and adjacent signal lines by extracting signal lines within a certain distance from the fault signal line as the adjacent signal lines based on layout information, as disclosed in Non-patent document 7 and 10.

However, the fault models of the device under test, the test generation methods, and the fault diagnosis methods proposed so far according to the prior arts have the following problems.

(1) As the fault model of the device under test, no fault model has been proposed which is formed with integrally considering the following:

(a) layout information such as the inter-wiring distance between the fault signal line and the adjacent signal line, the parallel distance between the fault signal line and the adjacent signal line, and wiring widths of the signal lines;

(b) manufacturing process information influencing electric characteristics such as distances between wiring layers, wiring materials, and insulating layer materials; and (c) timing information such as the directions of signal transitions on the signal lines, and the timing window of the signal transitions caused by the dynamic interference.

(2) No test generation method has been proposed which is intended to improve a fault detection ratio for faults of logic value changes due to the dynamic interference of the signal transition on the adjacent signal line.

3) No fault diagnosis method has been proposed which is integrally using the following as information for fault diagnosis:

(a) layout information such as the inter-wiring distance between the fault signal line and the adjacent signal line, the parallel distance between the fault signal line and the adjacent signal line, and wiring widths of the signal lines;

(b) manufacturing process information influencing electric characteristics such as distances between wiring layers, wiring materials, and insulating layer materials; and (c) timing information such as the directions of signal transitions on the signal lines, and the timing window of the signal transitions caused by the dynamic interference.

SUMMARY OF THE INVENTION

It is an object of the present invention to provide a fault test apparatus and a fault test method capable of solving the above-stated problems, and detecting a fault of a logic value change due to the dynamic interference of a signal transition on an adjacent signal line in a device under test with higher accuracy than that of the prior arts.

According to one aspect of the present invention, there is provided a fault test apparatus for testing a fault on each signal line in a circuit under test including a plurality of signal lines. The fault test apparatus includes a controller, which calculates a value of a fault excitation function for a fault signal line, using the fault excitation function representing a fitness result of a predetermined fault excitation condition between the fault signal line having a fault among the signal lines under test in the circuit under test and at least one of adjacent signal lines adjacent to the fault signal line and falling within a predetermined range from the fault signal line, based on layout information between the fault signal line and at least one adjacent signal line adjacent to the fault signal line, manufacturing parameter information, and timing information, and which determines whether or not a dynamic fault is excited on the fault signal line based on the value of the fault excitation function.

In the above-mentioned fault test apparatus, the fault excitation function is represented by a product of the following:

(a) a first factor based on a condition as to whether or not a parallel distance between the fault signal line and at least one adjacent signal line is equal to or larger than a predetermined first threshold value;

(b) a second factor based on a condition as to whether or not a wiring width ratio of the fault signal line to at least one adjacent signal line is equal to or larger than a predetermined second threshold value;

(c) a third factor based on a condition as to whether or not an interval from a signal transition timing of the fault signal line to a signal transition timing of at least one adjacent signal line is included in a predetermined timing window;

(d) a fourth factor based on a condition as to whether or not a signal transition on the fault signal line and a signal transition on at least one adjacent signal line are identical in a direction of a change in a sign of the signal transition with each other; and (e) a fifth factor based on an inter-wiring layer distance between the fault signal line and at least one adjacent signal line and an insulating material of inter-wiring layers.

In addition, in the above-mentioned fault test apparatus, the controller calculates a sum of values of fault excitation functions between the fault signal line and the respective adjacent signal lines, divides the calculated sum by number of the adjacent signal lines to calculate an average value of the fault excitation functions, and determines whether or not the dynamic fault is excited on the fault signal line based on whether or not the calculated average value of the fault excitation functions is equal to or larger than a predetermined third threshold value.

Further, in the above-mentioned fault test apparatus, the controller performs a fault-free circuit logic simulation in the circuit under test for each test pair in a test pair set including a plurality of predetermined test intervals, obtains a signal line on which an influence of complementary values to logic values obtained by the fault-free circuit logic simulation propagates to a primary output, determines whether or not the dynamic fault is excited on the fault signal line using the fault excitation function with the obtained signal line assumed as the fault signal line, and outputs a determination result.

Furthermore, in the above-mentioned fault test apparatus, the controller selects a transition fault test pair in which the dynamic fault of the fault signal line is undetected in the circuit under test using each test pair in the test pair set including the plurality of predetermined test intervals, obtains a test pair for the transition fault on the signal line, extracts Don't Care included in allocation of primary inputs so as to guarantee the transition fault in the selected signal line, performs a back tracing process from each of the adjacent signal lines including the Don't Care toward a primary input, and allocates a signal value for exciting the dynamic fault using the fault excitation function to the primary input including the Don't Care, thereby generating test pattern signals of the test pair.

Still further, in the above-mentioned fault test apparatus, the controller generates a fault candidate signal line set by performing the following:

(A) a first narrow-down process of determining whether or not the dynamic fault is excited on the fault signal line using the fault excitation function with each of the signal lines for a predetermined diagnosis assumed as the fault signal line using each fail test pair in a fail test set for the circuit under test, thereby narrowing down the fault signal line on which the dynamic fault is excited as a fault candidate signal line; and (B) a second narrow-down process of determining whether or not the dynamic fault is exited on the fault signal line using the fault excitation function with respect to the fault candidate signal lines using each pass test pair in a pass test set for the circuit under test, thereby excluding the fault signal line on which the dynamic fault is excited from the fault candidate signal lines.

Still more further, in the above-mentioned fault test apparatus, the controller further (C) generates and outputs a fault candidate ranking list according to number of times of fault signal line detection for the fault candidate signal line set after the second narrow-down process.

According to another aspect of the present invention, there is provided a fault test method for testing a fault on each signal line in a circuit under test including a plurality of signal lines. The fault test method includes a control step of calculating a value of a fault excitation function for a fault signal line, using the fault excitation function representing a fitness result of a predetermined fault excitation condition between the fault signal line having a fault among the signal lines under test in the circuit under test and at least one of adjacent signal lines adjacent to the fault signal line and falling within a predetermined range from the fault signal line, based on layout information between the fault signal line and at least one adjacent signal line adjacent to the fault signal line, manufacturing parameter information, and timing information, and then, determining whether or not a dynamic fault is excited on the fault signal line based on the value of the fault excitation function.

In the above-mentioned fault test method, the fault excitation function is represented by a product of the following:

(a) a first factor based on a condition as to whether or not a parallel distance between the fault signal line and at least one adjacent signal line is equal to or larger than a predetermined first threshold value;

(b) a second factor based on a condition as to whether or not a wiring width ratio of the fault signal line to at least one adjacent signal line is equal to or larger than a predetermined second threshold value;

(c) a third factor based on a condition as to whether or not an interval from a signal transition timing of the fault signal line to a signal transition timing of at least one adjacent signal line is included in a predetermined timing window;

(d) a fourth factor based on a condition as to whether or not a signal transition on the fault signal line and a signal transition on at least one adjacent signal line are identical in a direction of a change in a sign of the signal transition with each other; and (e) a fifth factor based on an inter-wiring layer distance between the fault signal line and at least one adjacent signal line and an insulating material of inter-wiring layers.

In addition, in the above-mentioned fault test method, the control step includes a step of calculating a sum of values of fault excitation functions between the fault signal line and the respective adjacent signal lines, dividing the calculated sum by number of the adjacent signal lines to calculate an average value of the fault excitation functions, and determining whether or not the dynamic fault is excited on the fault signal line based on whether or not the calculated average value of the fault excitation functions is equal to or larger than a predetermined third threshold value.

Further, in the above-mentioned fault test method, the control step includes a step of performing a fault-free circuit logic simulation in the circuit under test for each test pair in a test pair set including a plurality of predetermined test intervals, obtaining a signal line on which an influence of complementary values to logic values obtained by the fault-free circuit logic simulation propagates to a primary output, determining whether or not the dynamic fault is excited on the fault signal line using the fault excitation function with the obtained signal line assumed as the fault signal line, and outputting a determination result.

Furthermore, in the above-mentioned fault test method, the control step includes a step of selecting a transition fault test pair in which the dynamic fault of the fault signal line is undetected in the circuit under test using each test pair in the test pair set including the plurality of predetermined test intervals, obtaining a test pair for the transition fault on the signal line, extracting Don't Care included in allocation of primary inputs so as to guarantee the transition fault in the selected signal line, performing a back tracing process from each of the adjacent signal lines including the Don't Care toward a primary input, and allocating a signal value for exciting the dynamic fault using the fault excitation function to the primary input including the Don't Care, thereby generating test pattern signals of the test pair.

Still further, in the above-mentioned fault test method, the control step includes a step of generating a fault candidate signal line set by performing the following:

(A) a first narrow-down process of determining whether or not the dynamic fault is excited on the fault signal line using the fault excitation function with each of the signal lines for a predetermined diagnosis assumed as the fault signal line using each fail test pair in a fail test set for the circuit under test, thereby narrowing down the fault signal line on which the dynamic fault is excited as a fault candidate signal line; and (B) a second narrow-down process of determining whether or not the dynamic fault is exited on the fault signal line using the fault excitation function with respect to the fault candidate signal lines using each pass test pair in a pass test set for the circuit under test, thereby excluding the fault signal line on which the dynamic fault is excited from the fault candidate signal lines.

Still more further, in the above-mentioned fault test method, the control step further includes a step of (C) generating and outputting a fault candidate ranking list according to number of times of fault signal line detection for the fault candidate signal line set after the second narrow-down process.

According to the fault test apparatus and the fault test method according to the present invention, the logic value change on the fault signal line caused by the dynamic interference of the adjacent signal line can be dealt with in a more actual form by means of the dynamic fault model using the circuit layout information and the timing information in the circuit under test. The fault excitation function EX (LI, PI, TI) is calculated using the dynamic fault model shown in FIG. 2, and the fault signal line caused by the dynamic interference of the adjacent signal line is detected based on the calculated fault excitation function EX (LI, PI, TI). Therefore, it is possible to detect a fault that may possibly be missed in the fault test methods according to the prior arts, perform the fault test with higher accuracy, and remarkably improve the fault detection ratio. Moreover, the fault test and diagnosis can be executed to the next-generation LSI chip at the minimum cost. Besides, the fault test process can be automated and accelerated, so that the development of DFM (Design For Manufacture) technique for LSI chip production can be considerably promoted.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE INVENTION

Preferred embodiments of the present invention will be described hereinafter with reference to the accompanying drawings. In the preferred embodiments described below, similar components are denoted by the same reference symbols.

Summary of Preferred Embodiments

The inventors of the present invention propose a fault test method of testing a fault that logic value changes occur on a signal line due to the dynamic interference of an adjacent signal line by means of a fault excitation function using circuit layout information, manufacturing process information (also referred to as manufacturing parameter information), and timing information. Since the proposed fault excitation function can express the influence of more actual faults as compared with the fault excitation determination based on the stuck-at fault model according to the prior art, it is possible to prevent missing of faults in a fault test. The inventors of the present invention also propose a test generation method and a fault diagnosis method using a proposed fault model circuit. Specifically, the test generation method and the fault diagnosis method are characterized by modeling a fault that "logic value changes" occur on a fault signal line due to the dynamic interference of two or more adjacent signal lines by means of the fault excitation function constituted by the circuit layout information, the manufacturing process information, and the timing information.

First Preferred Embodiment

Figure 1:
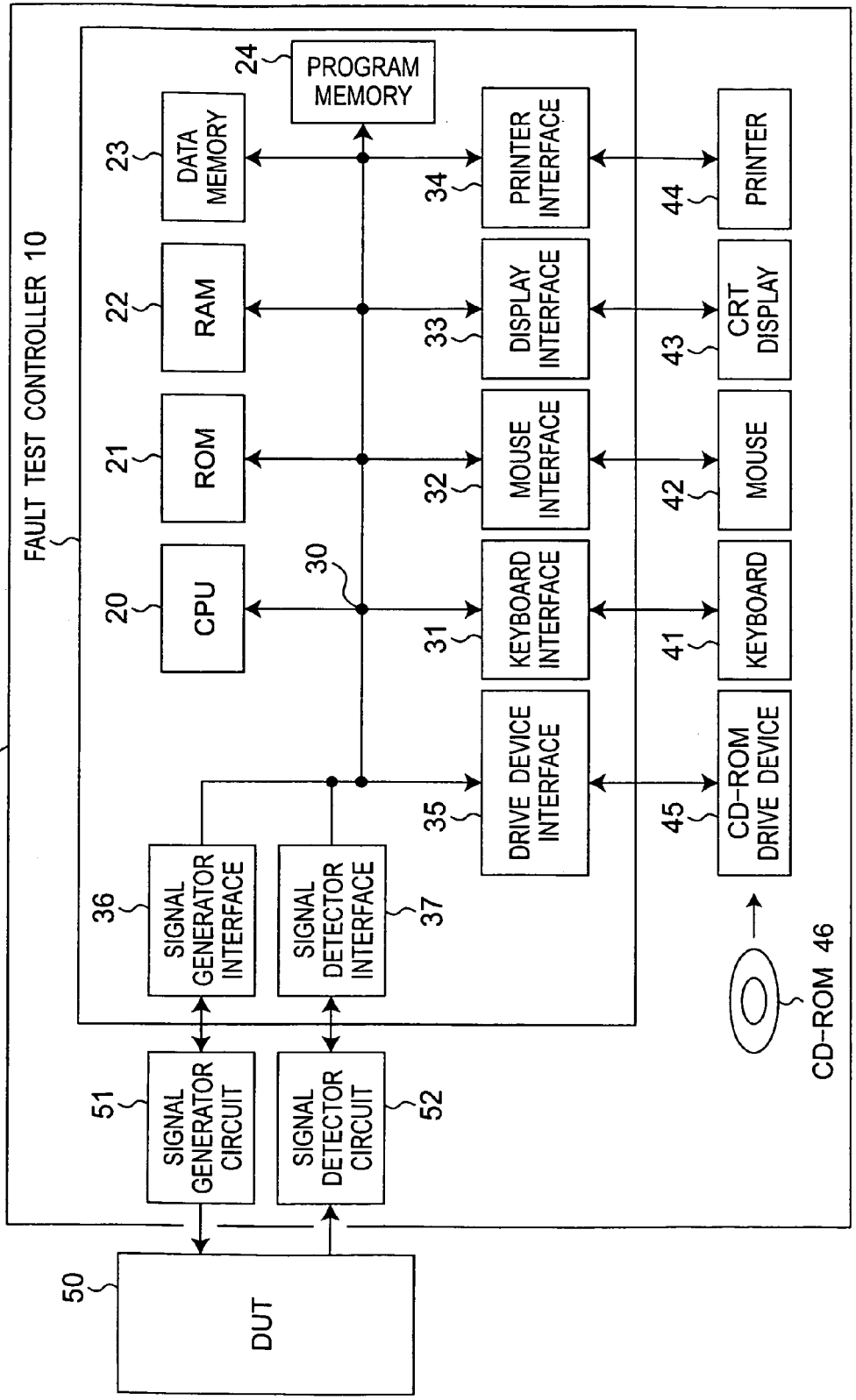
FIG. 1 is a block diagram showing a configuration of a fault tester apparatus 100 according to a first preferred embodiment of the present invention.
Figure 6:
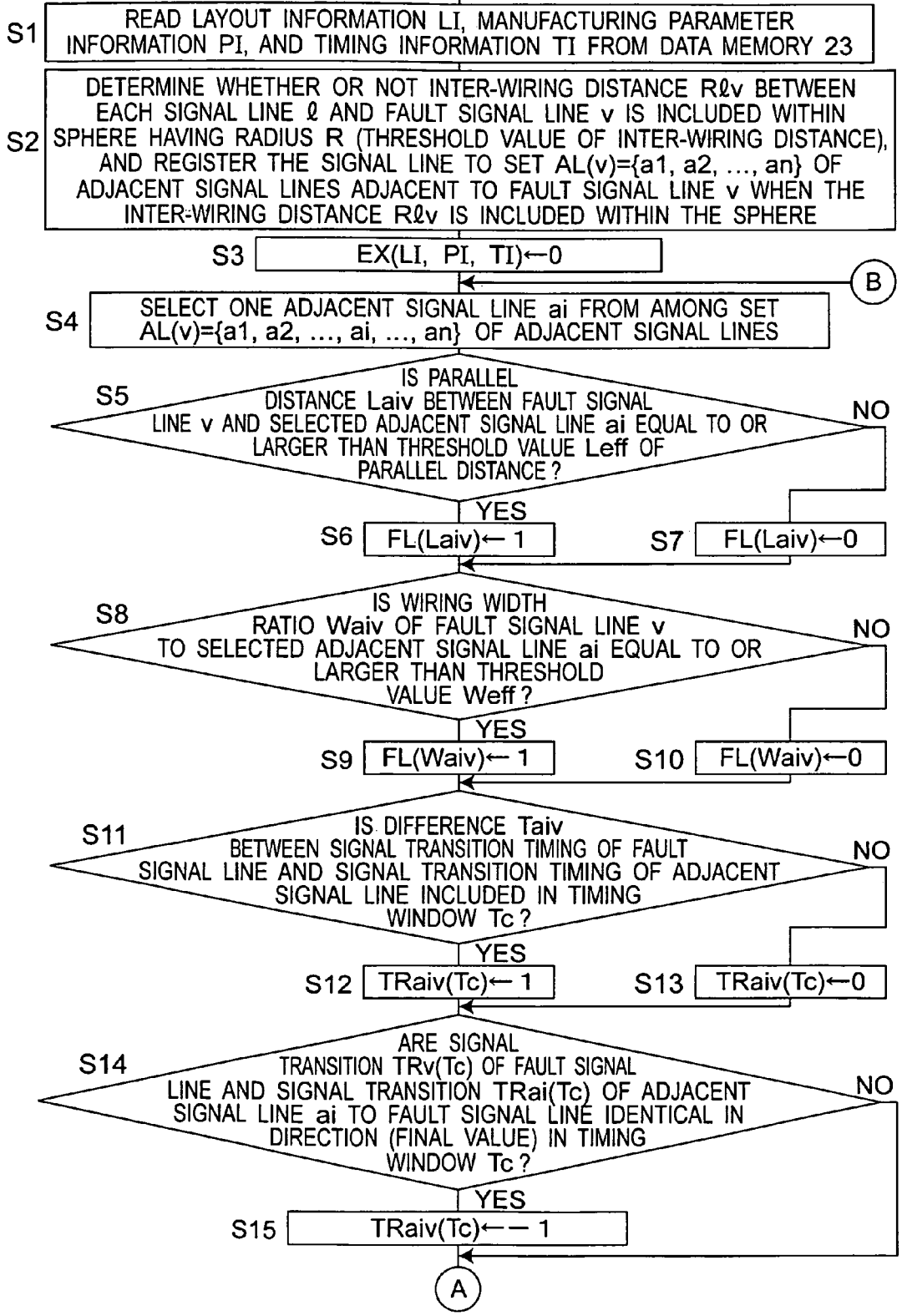
FIG. 6 is a flowchart showing a first part of a fault test process using a fault excitation function EX (LI, PI, TI) executed by a fault test controller 10 shown in FIG. 1.
Figure 7:
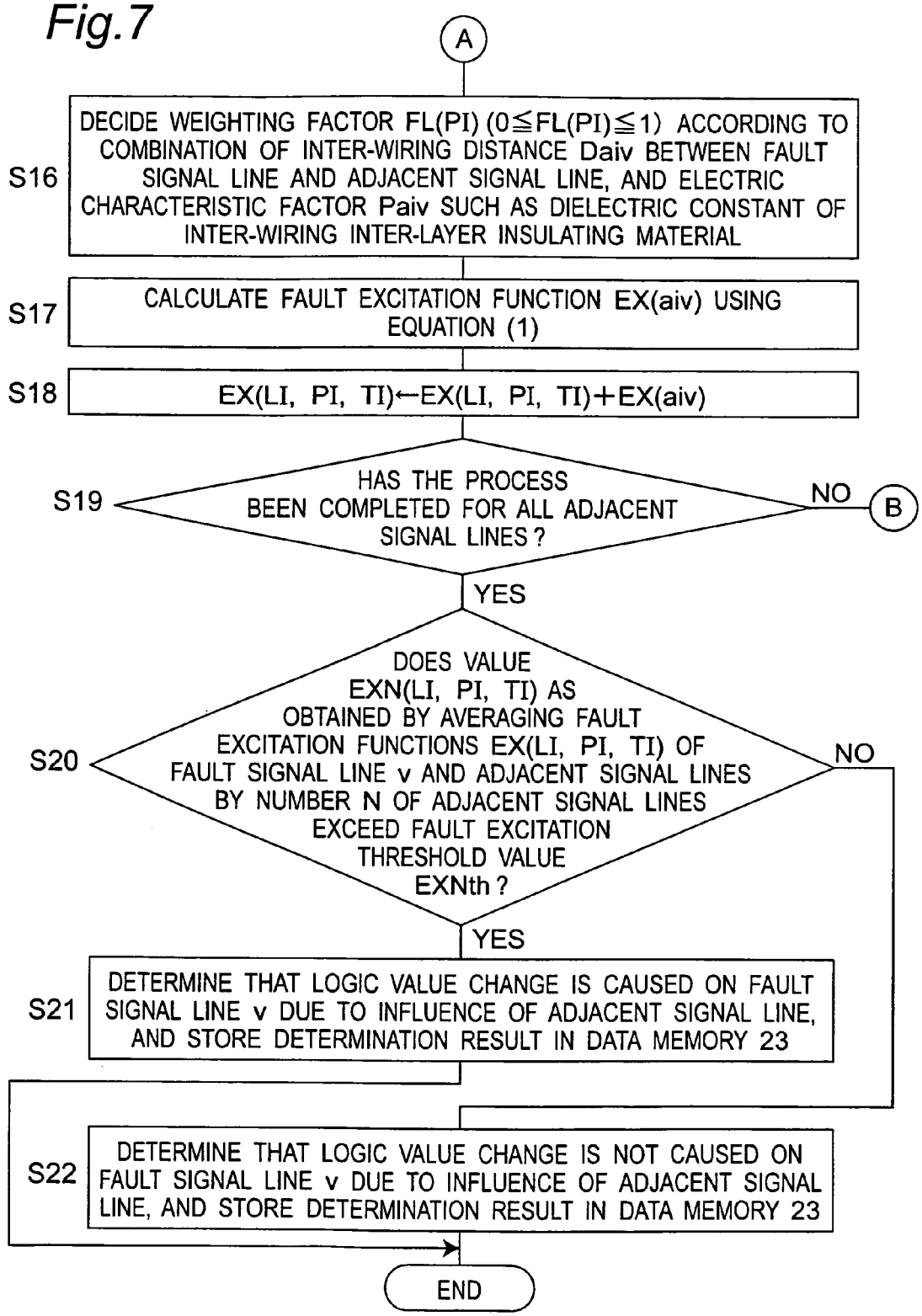
FIG. 7 is a flowchart showing a second part of the fault test process using the fault excitation function EX (LI, PI, TI) executed by the fault test controller 10 shown in FIG. 1.

FIG. 1 is a block diagram showing a configuration of a fault tester apparatus 100 according to a first preferred embodiment of the present invention. As shown in FIG. 1, the fault tester apparatus 100 according to the present preferred embodiment is configured to include a fault test controller 10 of a digital computer. The fault tester apparatus 100 is characterized by executing a fault test process shown in, for example, FIGS. 6 and 7 and displaying and outputting fault test results of the fault test process using a fault test model circuit shown in FIGS. 2 and 3. The fault test controller 10 includes the following:

(a) a CPU (central processing unit) 20 of the computer for calculating and controlling the operation and process performed by the fault test controller 10;

(b) a ROM (read only memory) 21 storing therein basic programs such as an operation program and data required for executing the basic programs;

(c) a RAM (random access memory) 22 operating as a working memory of the CPU 20, and temporarily storing therein the fault test process shown in FIGS. 6 and 7, and parameters and data required for the fault test process;

(d) a data memory 23 constituted by, for example, a hard disk memory, and storing therein such data as input parameter data and simulation result data;

(e) a program memory 24 constituted by, for example, a hard disk memory, and storing therein a program for the fault test process shown in FIGS. 6 and 7 read using a CD-ROM drive device 45;

(f) a keyboard interface 31 connected to a keyboard 41 for inputting predetermined data or an instruction command, receiving the data or instruction command inputted from the keyboard 41, performing an interface process such as predetermined signal conversion on the data, and transmitting the processed ones to the CPU 20;

(g) a mouse interface 32 connected to a mouse 42 for inputting data or an instruction command on a CRT display 43, receiving the data or instruction command inputted from the mouse 42, performing such an interface process as predetermined signal conversion on the data, and transmitting the processed data to the CPU 20;

(h) a display interface 33 connected to the CRT display 43 displaying the data processed by the CPU 20, a setting instruction screen and the like, converting image data to be displayed into an image signal for the CRT display 43, and outputting the image signal to the CRT display 43 to display the image signal on the CRT display 43;

(i) a printer interface 34 connected to a printer 44 printing out the data processed by the CPU 20, a predetermined fault test result and the like, performing predetermined signal conversion or the like on print data to be processed, and outputting the resultant signal to the printer 44 to print out the signal;

(j) a drive device interface 35 connected to the CD-ROM drive device 45 reading program data on the program for the fault test process shown in FIGS. 6 and 7 from a CD-ROM 46 storing therein the fault test process program, performing predetermined signal conversion or the like on the program data on the read fault test process program, and transferring the resultant signal to the program memory 24;

(k) a signal generator interface 36 receiving a binary signal generation instruction signal for a fault test generated by the CPU 20, converting the binary signal generation instruction signal into a signal having a predetermined signal form, and outputting the resulting signal to a signal generator circuit 51, to indicate the signal generator circuit 51 of generation of the binary signal; and (l) a signal detector interface 37 receiving an output signal from a device under test (referred to as a DUT hereinafter) 50 and detected by a signal detector circuit 52, converting the output signal into a signal having a predetermined signal form, and outputting the resulting signal to the CPU 20.

These circuits 20 to 24 and 31 to 37 are connected to one another via a bus 30.

In the first preferred embodiment, the fault test method using a fault model in consideration of the dynamic interference of an adjacent signal will be described as follows. First of all, definitions are given as follows.

(1) Definition of "fault signal line": A signal line presumed to have a fault (this means that a fault is present in a fault circuit) is defined as "fault signal line".

(2) Definition of "signal transition on signal line": Signal transitions on signal lines of a test pair <tn, tn+1> are each defined as a rising signal transition or a falling signal transition with a fixed value zero or one.

(3) Definition of "adjacent signal line": The distance between a fault signal line v and a signal line 1 is assumed as Rlv. If this distance Rlv is ranged within a threshold value R of an inter-wiring distance decided by a design parameter, the signal line is defined as an adjacent signal line ai adjacent to the fault signal line v. In this case, a set Al(v) of n adjacent signal lines ai, where n is an integer, adjacent to the fault signal line v is represented by the following Equation (1):

$$AL(v) = \{a1, a2, \ldots, an\} \quad (1).$$

Figure 2:
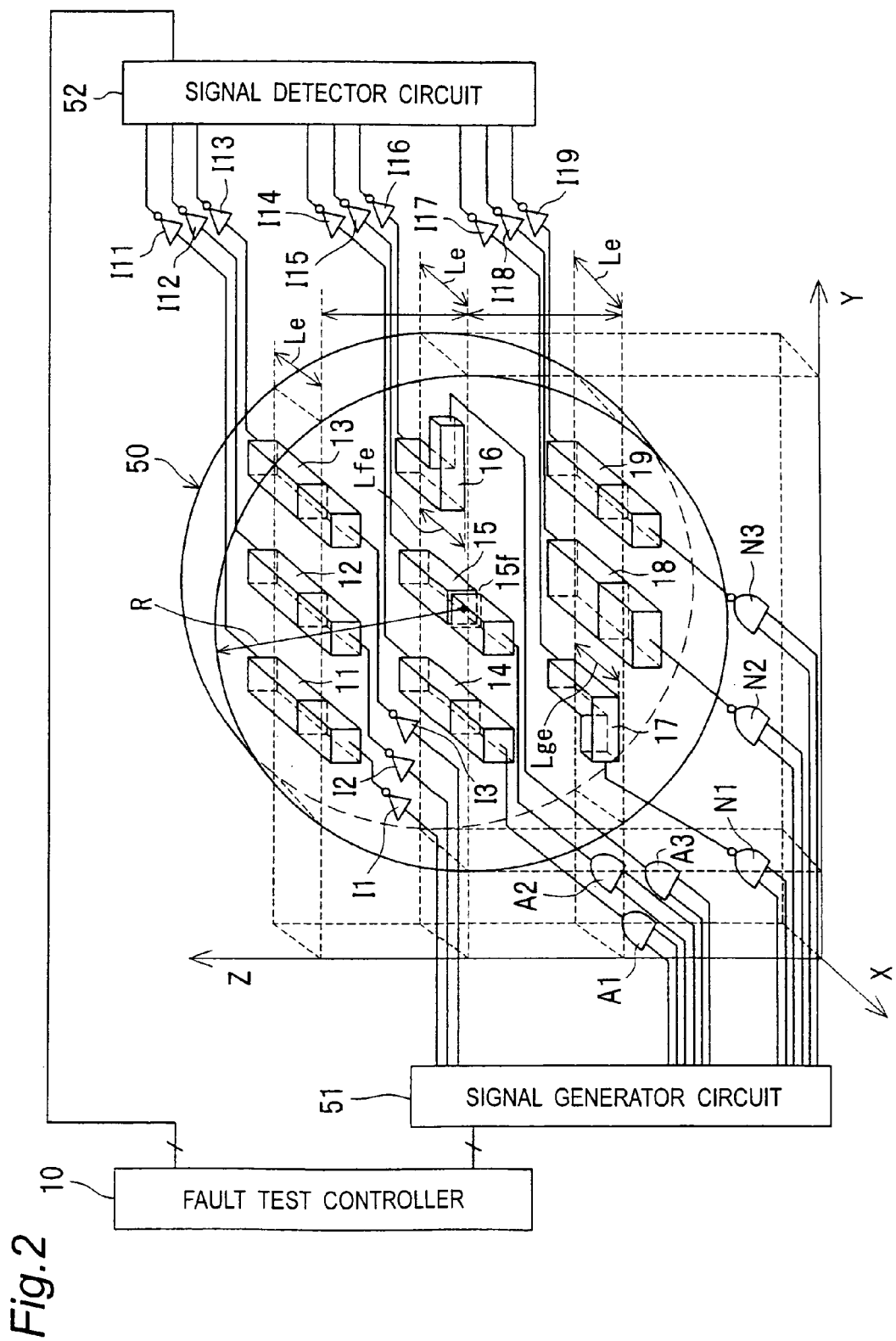
FIG. 2 is a perspective view and a block diagram showing an example of a fault test model circuit of a DUT 50 shown in FIG. 1.
Figure 3:
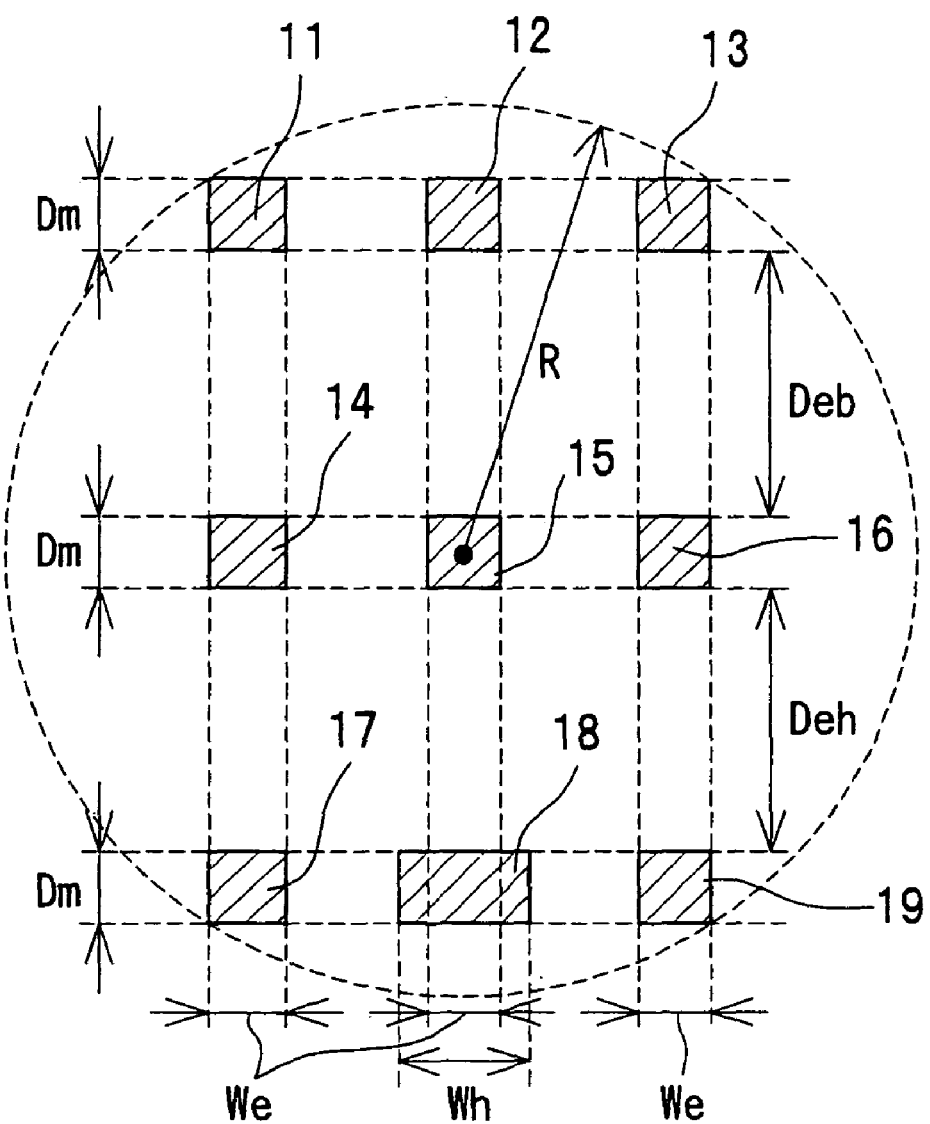
FIG. 3 is a longitudinal sectional view of the fault test model circuit shown in FIG. 2.

In the present preferred embodiment, a "dynamic fault model" with considering a dynamic interference of an adjacent signal line is proposed as a fault model representing a logic value change on the fault signal line caused by the dynamic interference of the adjacent signal line based on a fault excitation function EX (LI, PI, TI). FIG. 2 is a perspective view and a block diagram showing an example of a fault test model circuit of the DUT 50 shown in FIG. 1. FIG. 3 is a longitudinal sectional view of the fault test model circuit shown in FIG. 2. In the example of the fault test model circuit shown in FIG. 2, it is assumed that a breaking fault 15*f* occurs on a signal line 15 out of nine signal lines 11 to 19 within a sphere having a radius R from a certain point. Under control of the fault test controller 10, the signal generator circuit 51 generates a binary signal for a fault test and applies the binary signal to the respective signal lines 11 to 19 on the dynamic fault model circuit of the DUT 50 via inverters 11 to 13, AND gates A1 to A3, and NAND gates N1 to N3. The signal detector circuit 52 detects output signals outputted from the respective signal lines 11 to 19 in response to the application of the binary signal, and outputs detection results to the fault test controller 10.

In the present preferred embodiment, the fault model is proposed expressing the logic value change on the fault signal line as a logic value change in an output signal from a gate connected to the fault signal line and a logic value change on the adjacent signal line, in particular, using the "fault excitation function" constituted by circuit layout information (referred to as layout information hereinafter), manufacturing process information, and timing information. In this case, the layout information, the manufacturing parameter information, and the timing information constituting the fault excitation function are as follows.

(A) Layout Information LI:

(1) A distance Rai, v between the fault signal line v and the adjacent signal line ai (index "Rai, v" indicates the relationship between the fault signal line v and the adjacent signal line ai adjacent to the fault signal line v, the same shall apply hereafter. It is noted that "," may be often omitted.);

(2) A parallel distance Laiv between the fault signal line v and the adjacent signal line ai; and (3) A wiring width ratio Waiv of the fault signal line v to the adjacent signal line ai.

(B) Manufacturing Parameter Information PI:

(4) An inter-wiring layer distance Daiv between a wiring layer of the fault signal line v and a wiring layer of the adjacent signal line ai; and (5) An electric characteristic factor Daiv such as a dielectric constant of the insulating material between wiring layers.

(C) Timing Information TI:

(6) A logic value of a signal outputted from the gate connected to the fault signal line v is assumed as TRv(t). However, if a signal transition occurs on the fault signal line v, a final value of the signal transition is defined as TRv(t).

(7) A direction (final value) TRai(t) of the signal transition in a signal on the adjacent signal line ai;

(8) A difference Taiv in signal transition timing between the fault signal line v and the adjacent signal line ai; and (9) A timing window Tc (see FIGS. 4 and 5) of the signal transition influenced on the fault signal line v by the dynamic interference of the signal transition on the adjacent signal line ai.

In the dynamic fault model with considering the dynamic interference of the adjacent signal line, the logic value outputted from the fault signal line v is calculated according to the fault excitation function in consideration of these factors. It is assumed that the logic value change on the fault signal line v is LVv (t+Tf), where Tf represents a time interval for which the logic value change occurs on the fault signal line v due to the dynamic interference of the signal transition on the adjacent signal line ai. The logic value change LVv (t+Tf) on the fault signal line v is calculated based on the proposed fault excitation function EX (LI, PI, TI).

Next, a configuration of the fault excitation function EX (LI, PI, TI) according to the present preferred embodiment is shown below.

(A) Layout Information LI:

In the layout information LI, conditions (fault excitation conditions) that the fault signal line v has a logic value change due to the dynamic interference of the adjacent signal line ai are as follows:

(Condition 1) The adjacent signal line ai at the inter-wiring distance Raiv from the fault signal line v is ranged within the sphere having the radius R (threshold value of the inter-wiring distance (See FIG. 2)). In the dynamic fault model shown in FIG. 2, the signal lines 11 to 19 are included within the sphere having the radius R.

(Condition 2) The parallel distance Laiv is equal to or larger than a threshold value Leff of the parallel distance. In the dynamic fault model shown in FIG. 2, the signal lines 11 to 16 and 18 to 19 satisfy the condition 2 (Le≧Leff). However, since the parallel distance Lge of the signal line 17 is Lge<Leff, the signal line 17 does not satisfy the condition 2.

(Condition 3) The wiring width ratio Waiv (=Wiv/Wa) is equal to or larger than a threshold value Weff of the wiring width ratio. In the dynamic fault model shown in FIG. 2, the wiring width radio is expressed as Weh=Wh/We. It is to be noted that a conductor height of each of the signal lines 11 to 19 is Dm and that an inter-conductor distance in height direction is Deb or Deh.

(B) Manufacturing Parameter Information PI:

In the manufacturing parameter information PI, a weighting factor FL(PI) is decided according to the inter-wiring layer distance between the wiring layer having the fault signal line v and a wiring layer having the adjacent signal line ai and the dielectric constant of the inter-wiring layer insulating material.

Figure 4:
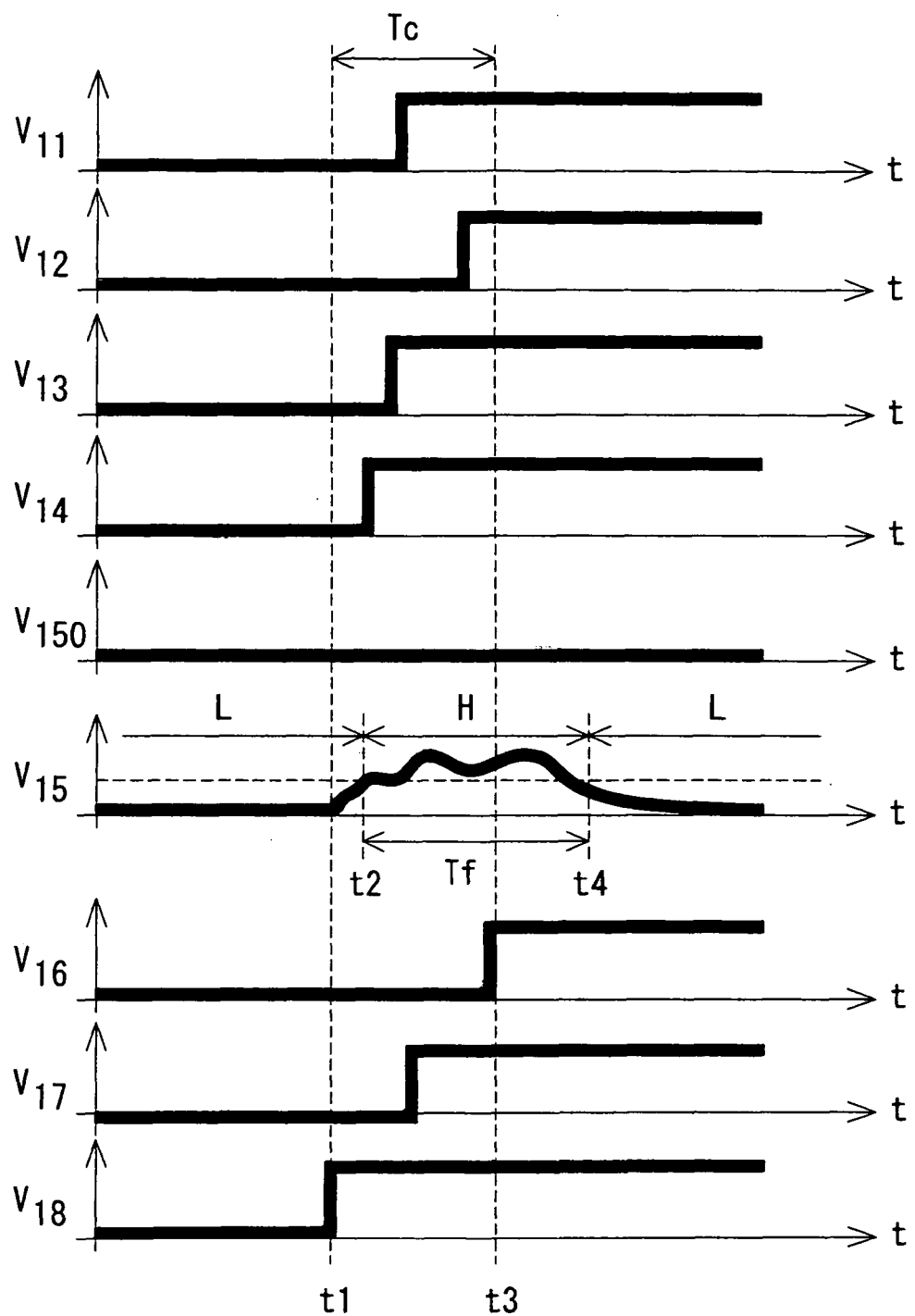
FIG. 4 is a timing chart showing an influence of a rising signal transition on an adjacent signal line in the fault test model circuit shown in FIG. 2.
Figure 5:
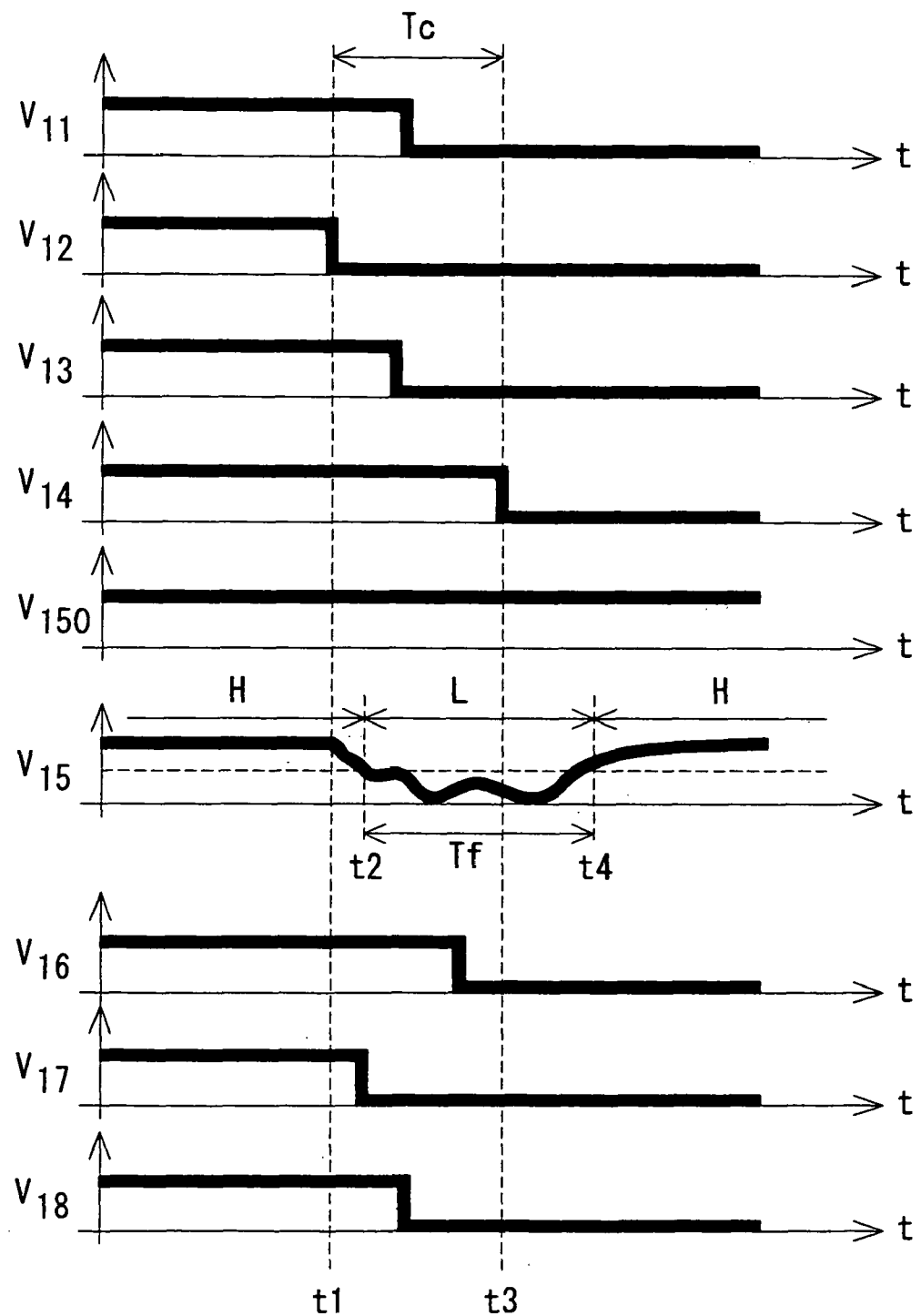
FIG. 5 is a timing chart showing an influence of a falling signal transition on the adjacent signal line in the fault test model circuit shown in FIG. 2.

(C) Timing Information TI:

In the timing information TI, conditions (fault excitation conditions) for the logic value change due to the dynamic interference of the adjacent signal line ai are as follows. As shown in FIGS. 4 and 5, Tc represents a width of timing at which the fault signal line v is influenced by the dynamic interference caused by the signal transition on the adjacent signal line ai, namely, an interval of the timing window of the signal transition for which the dynamic interference occurs. As shown in FIGS. 4 and 5, Tf represents a time interval for which a logic value change occurs on the fault signal line v due to the dynamic interference caused by the signal transition on the adjacent signal line ai.

(Condition 4) The difference Taiv in signal transition timing between the fault signal line v and the adjacent signal line ai is included within the timing window Tc.

(Condition 5) In the timing window Tc, the final value of the signal transition TRv (Tc) on the fault signal line v and the final value of the signal transition TRai (Tc) on the adjacent signal line ai hold a complementary relationship between them.

In the present preferred embodiment, as shown in FIG. 1, the fault tester apparatus 100 generates the binary signal of a test pair under control of the fault test controller 10. Thereafter, the binary signal is inputted to the DUT 50 using the fault test model (FIG. 2) to be described later, and the logic value change LVv (t+Tf) on the fault signal line v is calculated according to the fault excitation function EX (LI, PI, TI). The fault tester apparatus 100 determines whether or not each signal line in the DUT 50 has a fault based on the binary signal outputted from the DUT 50, and outputs a determination result.

FIG. 4 is a timing chart showing an influence of a rising signal transition on the adjacent signal line in the fault test model circuit shown in FIG. 2. FIG. 5 is a timing chart showing an influence of a falling signal transition on the adjacent signal line in the fault test model circuit shown in FIG. 2. In FIGS. 4 and 5, $V_{11}$ to $V_{18}$ indicate signal transitions on the signal lines 11 to 18, respectively, and $V_{150}$ indicates such a case that the fault signal line v is not influenced by the dynamic signal transition on the adjacent signal line. As obvious from FIG. 4, a signal voltage V15 of the signal line 15 changes from L level (Low level) to H level (High level) for the interval of the timing window Tc due to the influence of the rising signal transition on the adjacent signal line. Further, as obvious from FIG. 5, the signal voltage V15 of the signal line 15 changes from H level to L level for the interval of the timing window Tc due to the influence of the falling signal transition on the adjacent signal line.

FIGS. 6 and 7 are flowcharts showing a fault test process using the fault excitation function EX (LI, PI, TI) executed by the fault test controller 10 shown in FIG. 1. It is to be noted that the layout information LI, the manufacturing parameter information PI, and the timing information TI on the DUT 50 are stored in the data memory 23 in advance.

At step S1 shown in FIG. 6, the fault test controller 10 reads the layout information LI, the manufacturing parameter information PI, and the timing information TI from the data memory 23. At step S2, the fault test controller 10 determines whether or not the inter-wiring distance Rlv between each signal line 1 and the fault signal line v is included within the sphere having the radius R (threshold value of the inter-wiring distance). The fault test controller 10 registers the signal line 1 to the set AL(v)={a1, a2, . . . , an} of adjacent signal lines adjacent to the fault signal line v when the inter-wiring distance Rlv is included within the sphere. After clearing the fault excitation function EX {LI, PI, TI} to zero at step S3, the fault test controller 10 selects one adjacent signal line ai from among the set AL(v)={a1, a2, ai, . . . , an} of adjacent signal lines. At step S5, the fault test controller 10 determines whether or not the parallel distance Laiv between the fault signal line v and the selected adjacent signal line ai is equal to or larger than the threshold value Leff. If YES at step S5, the control flow goes to step S6. On the other hand, if NO at step S5, the control flow goes to step S7. The fault test controller 10 sets a parallel distance factor FL (Laiv) to one at step S6, and then the control flow goes to step S8. The fault test controller 10 sets the parallel distance factor FL (Laiv) to zero at step S7, and then, the control flow goes to step S8.

At step S8, the fault test controller 10 determines whether or not the wiring width ratio Waiv of the fault signal line v to the selected adjacent signal line ai is equal to or larger than the threshold value Weff of the wiring width ratio. If YES at step S8, the control flow goes to step S9. On the other hand, if NO at step S8, the control flow goes to step S10. The fault test controller 10 sets a wiring width ratio factor FL (Waiv) to one at step S9, and then, the control flow goes to step S11. The fault test controller 10 sets the wiring width ratio factor FL (Waiv) to zero at step S10, and then, the control flow goes to step S11.

At step S11, the fault test controller 10 determines whether or not the interval of the difference Taiv between the signal transition timing of the fault signal line v and the signal transition timing of the adjacent signal line ai (that is, the time interval from the signal transition timing of the fault signal line v to that of the adjacent signal line ai) is included within timing window Tc. If YES at step S11, the control flow goes to step S12. On the other hand, if NO at step S11, the control flow goes to step S13. The fault test controller 10 sets a signal transition factor TRaiv (Tc) to one at step S12, and then, the control flow goes to step S14. The fault test controller 10 sets the signal transition factor TRaiv (Tc) to zero at step S13, and then, the control flow goes to step S14. At step S14, the fault test controller 10 determines whether or not a direction of a signal transition TRv (Tc) of the fault signal line v and a direction of a signal transition TRai (Tc) of the adjacent signal line ai are identical with each other (final value: a change direction of a sign of the signal transition) in the timing window Tc. If YES at step S14, the control flow goes to step S15. On the other hand, if NO at step S14, the control flow goes to step S16 shown in FIG. 7. The fault test controller 10 sets the signal transition factor TRaiv (Tc) to −1 (indicating that the fault signal line v and the adjacent signal line ai are identical in the direction of the signal transition with each other) at step S15, and the control flow goes to step S16 shown in FIG. 7.

The process performed at step S15 has the following technical significance. As described in the condition 5, it is necessary for fault excitation that the complementary relationship is held between the final value of the signal transition TRv (Tc) on the fault signal line v and that of the signal transition TRai (Tc) on the adjacent signal line ai. Due to this, it is determined whether or not the fault signal line v is identical to the adjacent signal line ai in the direction of the signal transition at step S14. When the fault signal line v and the adjacent signal line ai are identical in the direction of the signal transition with each other, the signal transition TRaiv (Tc) is set to −1 (TRaiv (Tc)=−1). This is a minus function for fault excitation on the fault signal line v. A plus function for the fault excitation is that the fault signal line v differs in signal transition from the adjacent signal line ai. Accordingly, if NO at both of step S11 and S14, the signal transition TRaiv (Tc) of the fault signal line v is set to one (TRaiv (Tc)=1).

At step S16 shown in FIG. 7, the fault test controller 10 decides the weighting factor FL (PI) (0≦FL(PI)≦1) according to the combination of the inter-wiring distance Daiv between the fault signal line v and the adjacent signal line ai and the electric characteristic factor Paiv such as the dielectric constant of the inter-wiring layer insulating material (electric material characteristic value of the insulating material having influence on dynamic fault). The weighting factor FL (PI) is an index decided based on the combination of the inter-wiring layer distance Daiv (distance between wirings) between the fault signal line v and the adjacent signal line ai and the electric characteristic factor Paiv such as the dielectric constant of the insulating material of the inter-wiring layer and indicating a degree of easiness or possibility of occurrence of the dynamic fault. Next, at step S17, the fault test controller 10 calculates a fault excitation function EX (aiv) using the following Equation (2):

$$EX(aiv)=FL(Laiv) \times FL(Waiv) \times FL(PI) \times TRaiv(Tc) \quad (2).$$

At step S18, the fault test controller 10 adds the fault excitation function EX (aiv) to the fault excitation function EX (LI, PI, TI) to update the fault excitation function EX (LI, PI, TI). At step S19, the fault test controller 10 determines whether or not the process has been completed for all the adjacent signal lines. If YES at step S19, the control flow goes to step S20. On the other hand, if NO at step S19, the control flow returns to step S4 shown in FIG. 6. At step S20, the fault test controller 10 determines whether or not a value EXN (LI, PI, TI) (=EX (LI, PI, TI/N) as obtained by averaging fault excitation functions EX(LI PI, TI) of the fault signal line v and the adjacent signal lines by the number of adjacent signal lines N exceeds a fault excitation threshold value EXNth. If YES at step S20, the control flow goes to step S21. On the other hand, if NO at step S20, the control flow goes to step S22. The fault test controller 10 determines that the logic value changes on the fault signal line v due to the influence of the adjacent signal line, and stores the determination result in the data memory 23 at step S21, and the process is completed. The fault test controller 10 determines that logic value does not change due to the influence of the adjacent signal line on the fault signal line v at step S22, and stores the determination result in the data memory 23, and the process is completed.

A numeric implemental example of the fault test process shown in FIGS. 6 and 7 using the dynamic fault model shown in FIGS. 2 and 3 will be described below.

At step S2 shown in FIG. 6, all the signal lines within the sphere at the radius R from the fault signal line are set as the adjacent signal lines as shown in FIG. 2. In this case, the set AL (v)={11, 12, 13, 14, 16, 17, 18, 19} of adjacent signal lines adjacent to the fault signal line 15 shown in FIG. 2 are obtained. Next, at step S4, the adjacent signal line 11 is selected from among the set AL (v)={11, 12, 13, 14, 16, 17, 18, 19} of adjacent signal lines. At step S5, the parallel distance $L_{11, 15}$ between the fault signal line 15 and the adjacent signal line 11 is equal to or larger than the Leff (threshold value of the parallel distance given from design data). Therefore, the value of the FL ($L_{11, 15}$) is set to one. At step S8, the wiring width ratio $W_{11, 15}$ of the fault signal line 15 to the adjacent signal line 11 is equal to or larger than the Weff (threshold value of the wiring with ratio given from the design data). Therefore, the value of the FL ($W_{11, 15}$) is set to one. Further, at step S11, the difference Tae between the signal transition timing of the fault signal line 15 and that of the adjacent signal line 11 is included within the timing window Tc. Therefore, the value of the signal transition factor $TR_{11, 15}$ (Tc) is set to one. At step S14, the direction of the signal transition TRe (Tc) of the fault signal line 15 is different from the direction of the signal transition TRa (Tc) of the adjacent signal line 11 (final value). Therefore, the value of $TR_{11, 15}$ remains one. At step S16 shown in FIG. 7, the weighting factor FL (PI) is set to, for example, 0.5 according to the combination of the inter-wiring layer distance $D_{11, 15}$ between the fault signal line 15 and the adjacent signal line 11, and the electric characteristic factor $P_{11, 15}$ such as the dielectric constant of the inter-wiring layer insulating material. At step S17, the fault excitation function EX (11, 15) is calculated as represented by the following Equation (3):

$$\begin{aligned} EX\ (11, 15) &= FL\ (L_{11,15}) \times FL\ (W_{11,15}) \times FL\ (PL) \times TRae\ (Tc) \quad (3) \\ &= 1 \times 1 \times 0.5 \times 1 \\ &= 0.5. \end{aligned}$$

After adding 0.5 to the fault excitation function EX (LI, PI, TI), the similar process is performed and the following results are obtained:

$$\begin{aligned} EX\ (11, 15) =\ & EX\ (12, 15) = EX\ (13, 15) = EX\ (14, 15) = & (4) \\ & 0.5; \\ & EX\ (14, 15) = EX\ (16, 15) = 1; & (5) \\ & EX\ (19, 15) = -0.5; & (6) \\ & EX\ (18, 15) = 0;\ \text{and} & (7) \end{aligned}$$

$$\begin{aligned} EXN\ (LI, PI, TI) =\ & (EX\ (11, 15) + EX\ (12, 15) + EX(13, & (8) \\ & 15) + EX\ (14, 15) + EX\ (16, 15) + EX\ (17, \\ & 15) + EX\ (18, 15) + EX\ (19, 15))/8 \\ =\ & 0.35. \end{aligned}$$

If the value EXN of this fault excitation function is equal to or larger than the threshold value EXNth, it is determined that a logic value change occurs on the fault signal line 15.

As stated so far, according to the present preferred embodiment, the logic value change on the fault signal line caused by the dynamic interference of the adjacent signal line can be dealt with in a more actual form by means of the dynamic fault model using the circuit layout information and the timing information on the DUT 50. The fault excitation function EX (LI, PI, TI) is calculated using the dynamic fault model shown in FIG. 2, and the fault signal line caused by the dynamic interference of the adjacent signal line is detected based on the calculated fault excitation function EX (LI, PI, TI). Therefore, it is possible to detect a fault that may possibly be missed in the fault test methods according to the prior arts, perform the fault test at higher accuracy, and remarkably improve the fault detection ratio. Moreover, the fault test and diagnosis can be executed to the next-generation LSI chip at the minimum cost. Besides, the fault test process can be automated and accelerated, so that the development of DFM (Design For Manufacture) technique for LSI chip production can be considerably promoted.

Second Preferred Embodiment

Figure 8:
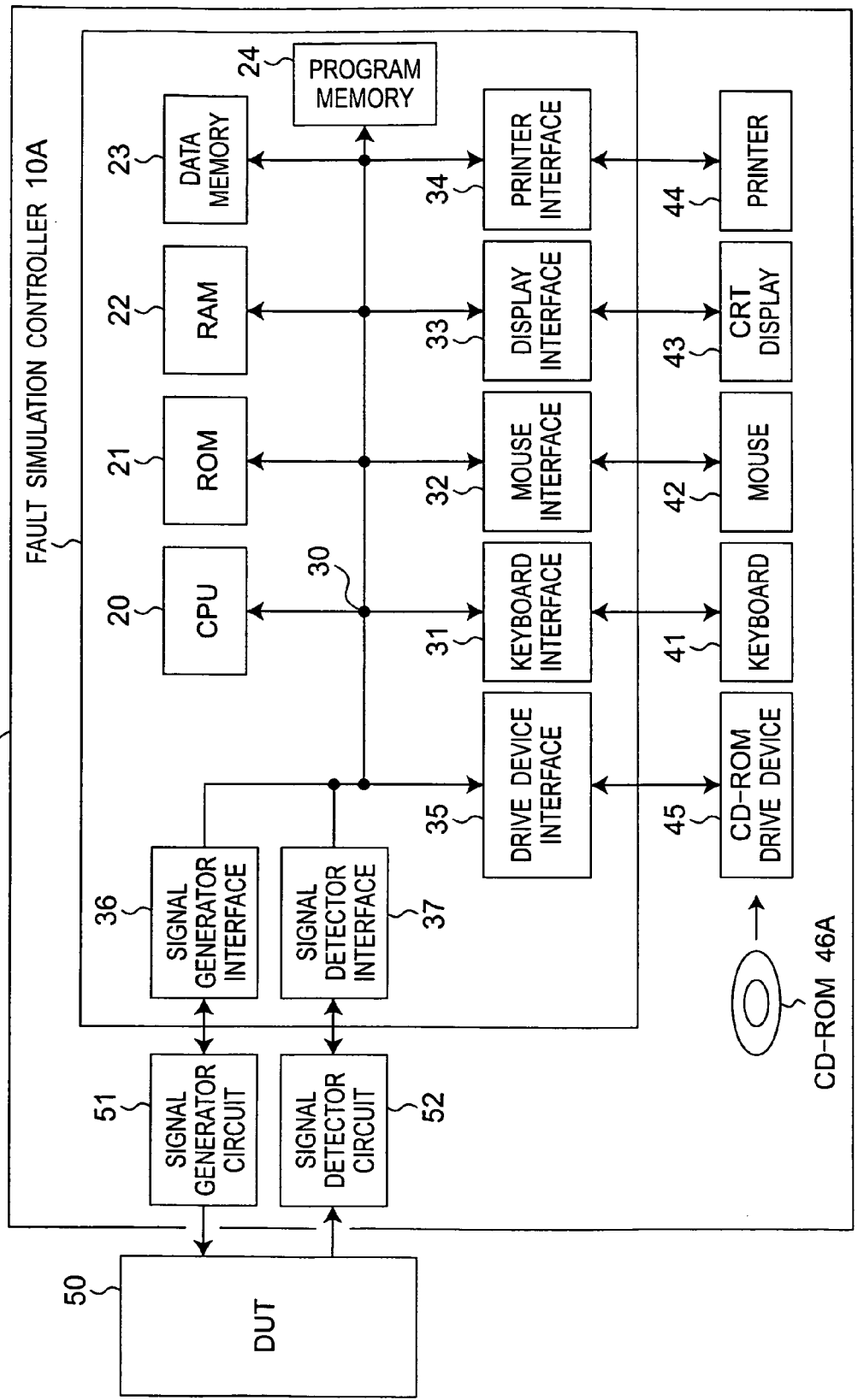
FIG. 8 is a block diagram showing a configuration of a fault simulator apparatus 100A according to a second preferred embodiment of the present invention.

FIG. 8 is a block diagram showing a configuration of a fault simulator apparatus 100A according to a second preferred embodiment of the present invention. In the second preferred embodiment, the fault simulator apparatus 100A simulating the behavior of a fault using the fault model (according to the first preferred embodiment) in consideration of the dynamic interferences of adjacent signal lines is proposed. The fault simulator apparatus 100A shown in FIG. 8 is configured to include a fault simulation controller 10A. The fault simulator apparatus 100A is similar in configuration to the fault tester apparatus 100 shown in FIG. 1 except for the following points.

Figure 9:
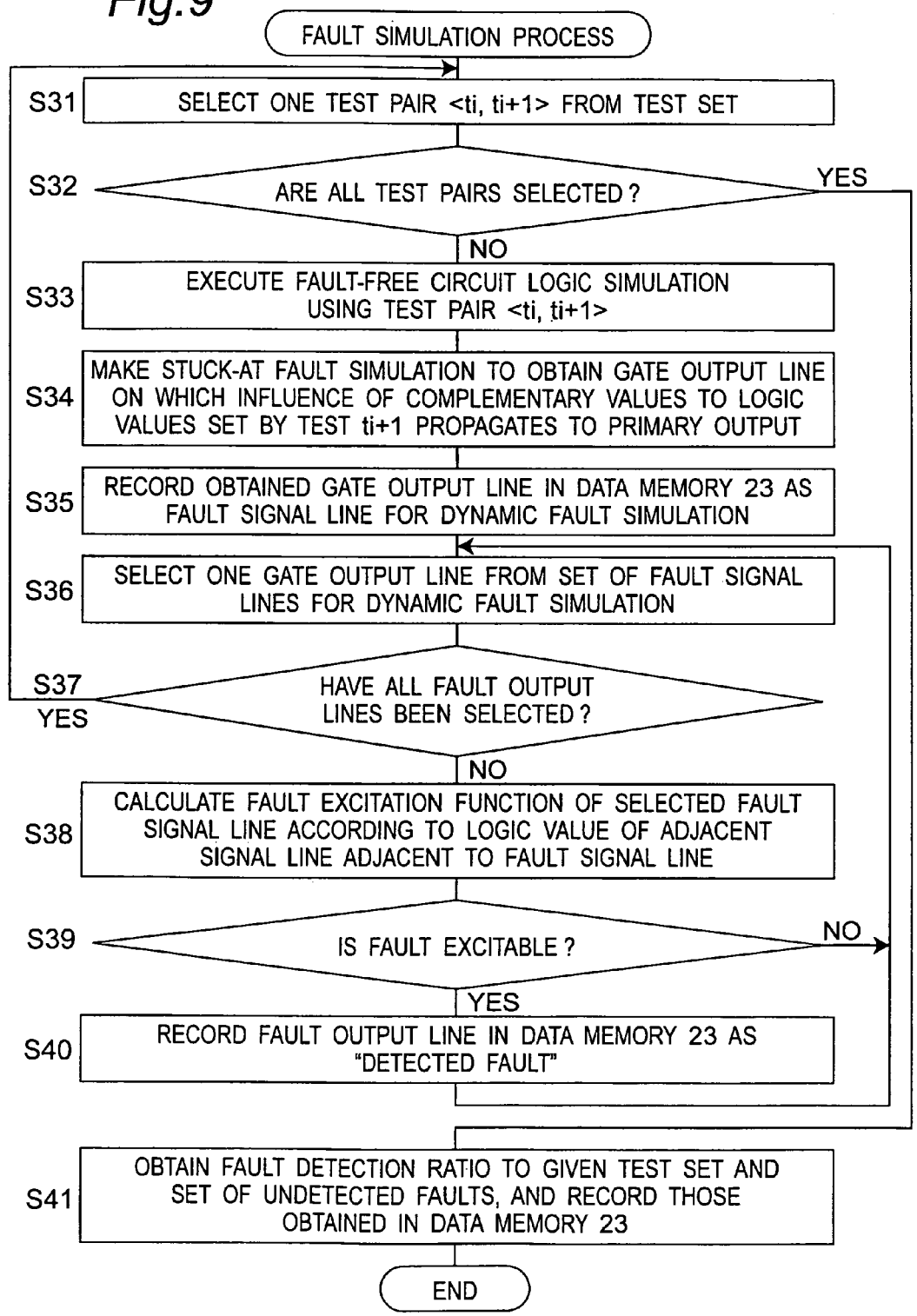
FIG. 9 is a flowchart showing a fault simulation process executed by a fault simulation controller 10A shown in FIG. 8.

(1) A program for a fault simulation process (also referred to as a fault simulation process program shown in FIG. 9 is stored in a program memory 24 and executed. Alternatively, the program for the fault simulation process shown in FIG. 9 stored in a CD-ROM 46A may be stored in the program memory 24 via a drive device interface 35.

(2) The data required for executing the fault simulation process program is stored in a data memory 23 in advance.

By using the fault simulator apparatus 100A based on the dynamic fault model according to the second preferred embodiment, a dynamic fault detection ratio of a given test set can be calculated. A set of faults that cannot be detected by the given test set can be also obtained. The fault simulator apparatus 100A based on the dynamic fault model will be also referred to as a dynamic fault simulator 100A hereinafter.

In the second preferred embodiment, input information (for example, information stored in the CD-ROM 46A and then stored in the data memory 23 via the CD-ROM drive device 45) inputted to the dynamic fault simulator apparatus 100A includes the following information:

(1) Circuit description (electronic-circuit circuit connection information) of a DUT 50;
(2) Circuit layout information (sizes of a plane, a cross section and the like) on the DUT 50;
(3) Timing information on respective signals when the DUT 50 operates;
(4) A fault signal line list for the signal lines in the DUT 50;
(5) An output signal line list of all gate output signal lines in the DUT 50; and
(6) A set of tests (each including a pair under test in a time interval from certain first timing to second timing (referred to as a test pair hereinafter)) in the DUT 50.

By executing the fault simulation process based on the input information, the fault detection ratio of the test set (a ratio of the number of dynamic faults detectable by the test set to a total number of faults) can be calculated. Furthermore, if the input information inputted to the dynamic fault simulator 100A includes the circuit description, the circuit layout information, the timing information, the target faults, and the test set, information on detection/non-detection of the faults can be obtained.

FIG. 9 is a flowchart showing a fault simulation process executed by the fault simulation controller 10A shown in FIG. 8.

At step S31, the fault simulation controller 10A selects one test pair <ti, ti+1> from the test set. At step S32, the fault simulation controller 10A determines whether or not all test pairs have been selected. If YES at step S32, the control flow goes to step S41. On the other hand, if NO at step S32, the control flow goes to step S33. At step S33, a fault-free circuit logic simulation using the test pair <ti, ti+1> is executed based on, for example, one of the logic simulation methods according to the prior arts disclosed in Patent documents 1 to 4. The contents of the Patent documents 1 to 4 are included herein by reference. In other words, in the interval of the test pair <ti, ti+1>, logic values (signal values) of output signals when the same circuit (DUT 50) operates logically normally with changing the respective input signals are obtained and recorded in the data memory 23. At step S34, the fault simulation controller 10A makes a stuck-at fault simulation according to, for example, one of the prior arts disclosed in Patent documents 6 and 7 to obtain a gate output line on which the influence of complementary values to logic values set by the test ti+1 propagates to a primary output. The contents of the Patent documents 6 and 7 are included herein by reference. In other words, the fault simulation controller 10A makes a fault simulation on the assumption that any one of nodes of the respective gates is fixed to a power source voltage or a ground voltage. At step S35, the fault simulation controller 10A records the gate output line in the data memory 23 as a fault signal line for a dynamic fault simulation. At step S36, the fault simulation controller 10A selects one gate output line from a set of fault signal lines for the dynamic fault simulation. At step S37, the fault simulation controller 10A determines whether or not all fault output lines have been selected. If YES at step S37, the control flow returns to step S31. On the other hand, if NO at step S37, the control flow goes to step S38.

At step S38, the fault simulation controller 10A calculates a fault excitation function of the fault signal line selected at step S38 according to the logic value of the adjacent signal line adjacent to the fault signal line. At step S39, the fault simulation controller 10A determines whether or not the fault is excitable using the fault test process according to the first preferred embodiment. If YES at step S39, the control flow goes to step S40. On the other hand, if NO at step S39, the control flow returns to step S36. At step S40, the fault simulation controller 10A records the fault output line in the data memory 23 as "detected fault" (information on the signal line (signal line information) on which a fault is detected). Thereafter, the control flow returns to step S36, and the above-stated process is repeated. When all the test pairs have been selected (YES at step S32), the fault simulation controller 10A obtains the fault detection ratio (a ratio of the test pair to be failed with respect to all the test pairs of the test set) of the given test set and a set of undetected faults (information on signal lines on which faults are not detected), and records those obtained information in the data memory 23 at step S41. Thereafter, the fault simulation controller 10A outputs the results to a printer 44 to cause the printer 44 to print out the result or outputs the result to a CRT display 43 to display the result on the CRT display 43, and the process is completed.

As stated so far, according to the present preferred embodiment, the fault excitation function EX (LI, PI, TI) is calculated using the dynamic fault model according to the first preferred embodiment. The fault caused by the dynamic interference of the adjacent signal lines is excited based on the calculated fault excitation function EX (LI, PI, TI). It is thereby possible to obtain the fault detection ratio of the test set and obtain information on signal lines on which faults are detected and information on signal lines on which faults are not detected. Therefore, the fault simulation can be made with exciting the faults that may possibly be missed by the fault simulation methods according to the prior arts, the fault simulation can be made with higher accuracy than that of the prior arts, and the fault detection ratio can be calculated with higher accuracy than that of prior arts.

Third Preferred Embodiment

Figure 10:
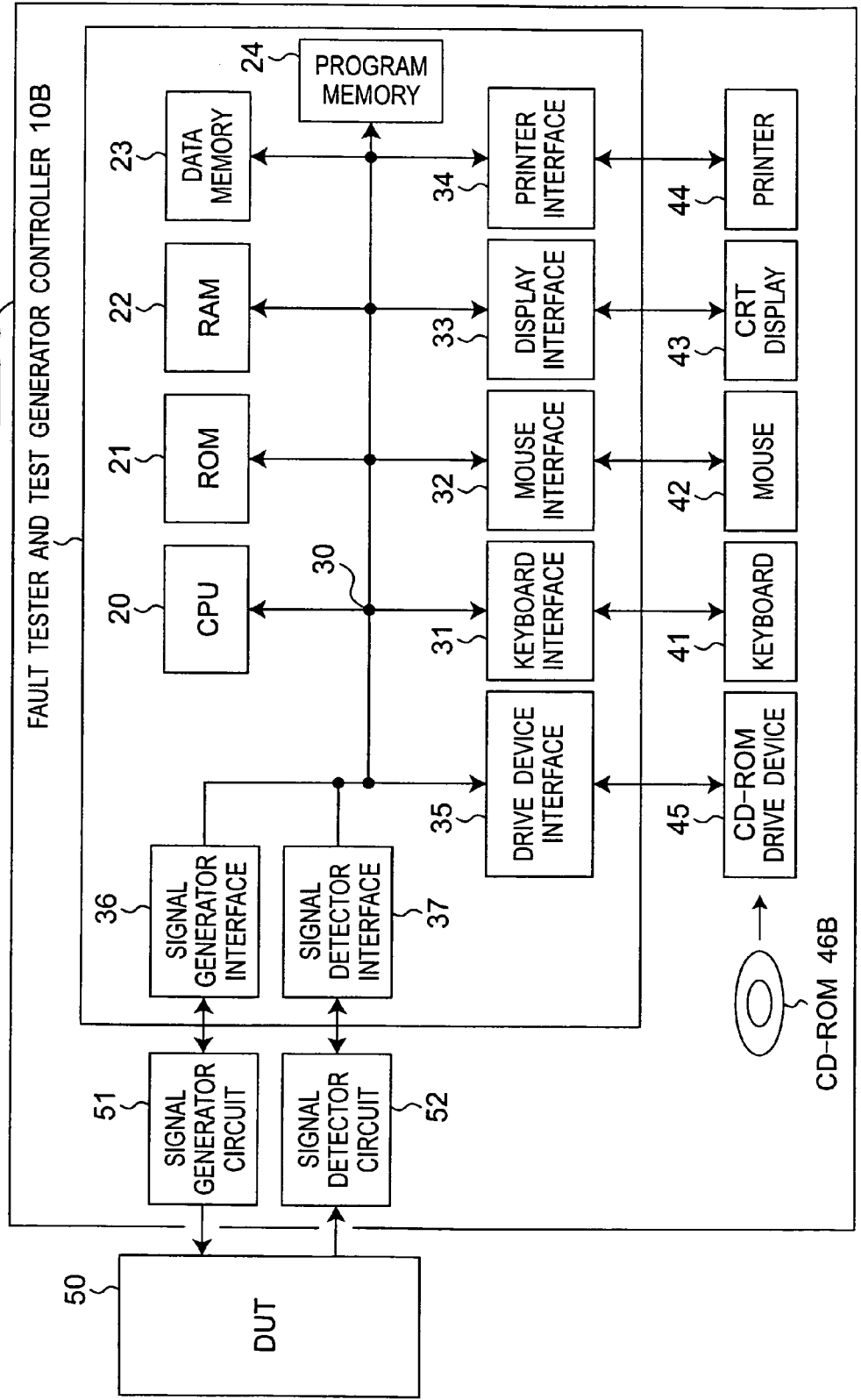
FIG. 10 is a block diagram showing a configuration of a fault tester and test generator apparatus 100B according to a third preferred embodiment of the present invention.

FIG. 10 is a block diagram showing a configuration of a fault tester and test generator apparatus 100B according to a third preferred embodiment of the present invention. In the third preferred embodiment, the fault tester and test generator apparatus 100B generating test pattern signals (binary signals) of an appropriate test pair (information on a time interval of binary signals used when a fault test is executed) for a DUT 50 using the dynamic fault model (according to the first preferred embodiment) in consideration of dynamic interferences of adjacent signal lines is proposed. The fault tester and test generator apparatus 100B shown in FIG. 10 is configured to include a fault tester and a test generator controller 10B. The fault tester and test generator apparatus 100B is similar in configuration to the fault tester apparatus 100 shown in FIG. 1 except for the following points.

(1) A program for a test generation process shown in FIG. 11 (also referred to as a test generation process program hereinafter) is stored in a program memory 24 and executed. Alternatively, the program for the test generation process shown in FIG. 11 stored in a CD-ROM 46B may be stored in the program memory 24 via a drive device interface 35.

(2) The data required for executing the test generation process program is stored in a data memory 23 in advance.

Figure 11:
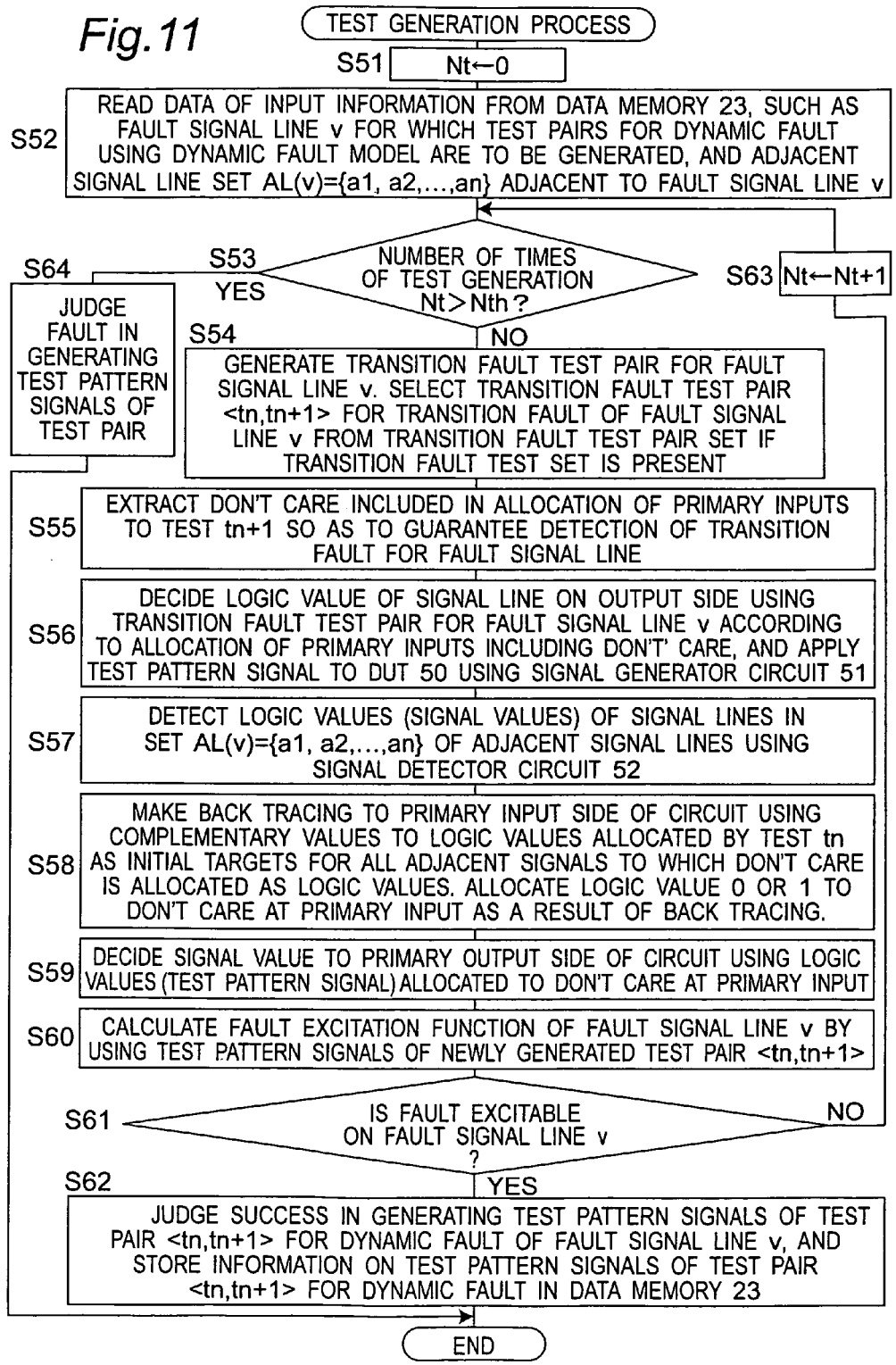
FIG. 11 is a flowchart showing a test generation process executed by a fault tester and test generator controller 10B shown in FIG. 10.

FIG. 11 is a flowchart showing a test generation process executed by the fault tester and test generator controller 10B shown in FIG. 10. The test generation process according to the third preferred embodiment will be described. In the present preferred embodiment, test pattern signals of a test pair are generated based on a fault excitation function with considering the influence of the adjacent signal lines using the dynamic fault model. Fault excitation conditions and fault propagation conditions can be defined as follows.

If input test pattern signals of a test pair satisfy the following fault excitation conditions and fault propagation conditions, the input test pattern signals are test pattern signals for a dynamic fault. Fault detection conditions based on the dynamic fault model include (A) dynamic fault excitation conditions on a signal line v and (B) dynamic fault propagation conditions on the signal line v.

(A) Dynamic Fault Excitation Conditions on the Signal Line v

In the dynamic fault model, a logic value change on the fault signal line v obtained according to the combination of the input test pattern signals of the test pair is a complementary value to a signal value in a fault-free circuit. It is noted that the logic value change on the fault signal line v is obtained using a fault excitation function EX (LI, PI, TI) represented by the following Equation (9):

$$LVv(t+Tf)=EX(LI,PI,TI) \qquad (9).$$

In other words, a fault excitation ratio of the logic value change for an interval Tf from certain timing t is used as the fault excitation function EX (LI, PI, TI).

(B) Dynamic Fault Propagation Conditions on the Signal Line v

The influence of the fault excited on the fault signal line v is propagated to any one of primary outputs.

The fault detection conditions based on the dynamic fault model differ from those of the stuck-at fault model, the bridge fault model, the crosstalk fault model, and the delay fault model proposed so far. Therefore, physical failures missed in the fault test using the test set generated by the test generation method for one of the fault models according to the prior arts may possibly be detected. According to the prior arts, how effective a test set generated by an existing automatic test generator tool (so-called EDA (Electric Design Automation) tool) for transition delay fault is to faults or failures other than transition faults cannot be evaluated. The dynamic fault detection ratio of the test set generated by the existing automatic test generator tool for transition delay fault (for example, using one of fault test methods disclosed in Patent documents 8 and 9; and the contents of the Patent documents 8 and 9 are included herein by reference) can be evaluated using test conditions for the dynamic fault model proposed according to the present preferred embodiment. Furthermore, according to the evaluation results related to the dynamic fault detection ratio, tests are generated for dynamic fault that cannot be detected by the test set generated using the existing automatic test generator tools for transition delay fault. By using the proposed test generation program, generation of test pattern signals of test pairs for dynamic faults can be executed with adjusting the relationship between the desired dynamic fault detection ratio and the total number of tests.

The test generation program based on the dynamic fault model according to the present preferred embodiment includes the following procedures.

(1) Dynamic faults that cannot be detected by the test set generated by the existing automatic test generator tool for transition delay faults are used as objective to be generated for test pattern signals of test pairs.

(2) Select a signal line having an undetected dynamic fault, and obtain test pattern signals of a test pair for a transition fault of the selected signal line. The transition fault means a fault that a signal value of the signal line moves to an incorrect value for input test pattern signals.

(3) Extract Don't Care included in allocation of primary inputs so as to guarantee detection of the transition fault on the fault signal line for obtained test pattern signal.

(4) Make back tracing toward a primary input side from an adjacent signal line including Don't Care, and allocate a logic value required for satisfying the dynamic fault excitation conditions to primary input test pattern signals including Don't Care.

(5) Calculate the fault excitation function according to the logic value allocated to the primary input test pattern signals. If it is determined from the results of calculation that the dynamic fault excitation conditions are satisfied on the signal line under test, test pattern signals of test pairs for dynamic faults can be generated.

The test generation program based on the dynamic fault model according to the present preferred embodiment will next be described. Input information and output information are as follows.

(A) Input information: Layout information, manufacturing process information, and timing information in the circuit under test (i.e., a device under test (DUT) 50) obtained at design and manufacturing phases; a set of transition fault tests, and a set of undetected dynamic faults that are not detected by the test set; an upper limit value for generation of transition fault tests.

(B) Output information: A set of test pattern signals of generated test pairs and a set of signal lines having dynamic faults that can be detected by the set of test pairs.

Referring to FIG. 11, the test generation process will further be described. At step S51, the fault tester and test generator controller 10B resets the number of times of test generation Nt to zero. At step S52, the fault tester and test generator controller 10B reads data of input information (input test pattern signals) from the data memory 23, such as the fault signal line v for which test pattern signals of test pairs for a dynamic fault using dynamic fault model are to be generated, and a set AL(v)={a1, a2, ..., an} of adjacent signal lines adjacent to the fault signal line v. At step S53, the fault tester and test generator controller 10B determines whether or not the number of times of test generation Nt is larger than Nt (Nt>Nth). If YES at step S53, the control flow goes to step S64. On the other hand, if NO at step S53, the control flow goes to step S54. At step S54, the fault tester and test generator controller 10B generates test pattern signals of a transition fault test pair for the fault signal line v. The fault tester and test generator controller 10B selects a transition fault test pair <tn, tn+1> for the transition fault of the fault signal line v from a transition fault test pair set if the transition fault test set is present. At step S55, the fault tester and test generator controller 10B extracts Don't Care included in allocation of primary inputs to the test pattern signal of the test tn+1 so as to guarantee detection of the transition fault for the fault signal line v.

At step S56, the fault tester and test generator controller 10B decides a logic value (signal value) of a signal line on an output side using the test pattern signals of the transition fault test pair for the fault signal line v according to allocation of primary inputs including Don't'Care, and applies the test pattern signals to a DUT 50 using a signal generator circuit 51. In response to this, at step S57, the fault tester and test generator controller 10B detects logic values (signal values) of signal lines in the set AL(v)={a1, a2, ..., an} of adjacent signal lines using a signal detector circuit 52. At step S58, the fault tester and test generator controller 10B makes back tracing toward a primary input side of the circuit (DUT 50) using complementary values to logic values allocated by the test pattern signal of the test tn as initial targets for adjacent signals of all adjacent signals to which Don't Care is allocated as logic values. Further, the fault tester and test generator controller 10B allocates a logic value zero or one to the Don't Care at the primary input as a result of the back tracing.

At step S59, the fault tester and test generator controller 10B decides a signal value to the primary output side using the logic values (test pattern signal) allocated to the Don't Care at the primary input. At step S60, the fault tester and test generator controller 10B calculates the fault excitation function of the fault signal line v by the test pattern signals of the newly generated test pair <tn, tn+1>. At step S61, the fault tester and test generator controller 10B determines whether or not the fault is excitable on the fault signal line v. If YES at step S61, the control flow goes to step S62. On the other hand, if NO at step S61, the control flow goes to step S63. At step S63, the fault tester and test generator controller 10B increments the number of times of test generation Nt by one, and then, the control flow returns to step S53. At step S62, the fault tester and test generator controller 10B determines success in generating the test pattern signals of the test pair <tn, tn+1> for the dynamic fault of the fault signal line v, and stores information on the test pattern signals of the test pair <tn, tn+1> for the dynamic fault in the data memory 23, and the process is completed. It is to be noted that if YES at step S53, the fault tester and test generator controller 10B determines that the generation of test pattern signals of test pairs fails, and the process is completed.

As stated so far, according to the present preferred embodiment, the fault excitation function EX (LI, PI, TI) can be calculated using the dynamic fault model according to the first preferred embodiment, and the test pattern signals of the test pair for the dynamic fault generated due to the influence of the dynamic interferences of the adjacent signal lines can be generated based on the calculated fault excitation function EX (LI, PI, TI). Therefore, as compared with the test generation methods according to the prior arts, the test pattern signals of test pairs can be generated with higher accuracy than that of the prior arts.

Fourth Preferred Embodiment

Figure 12:
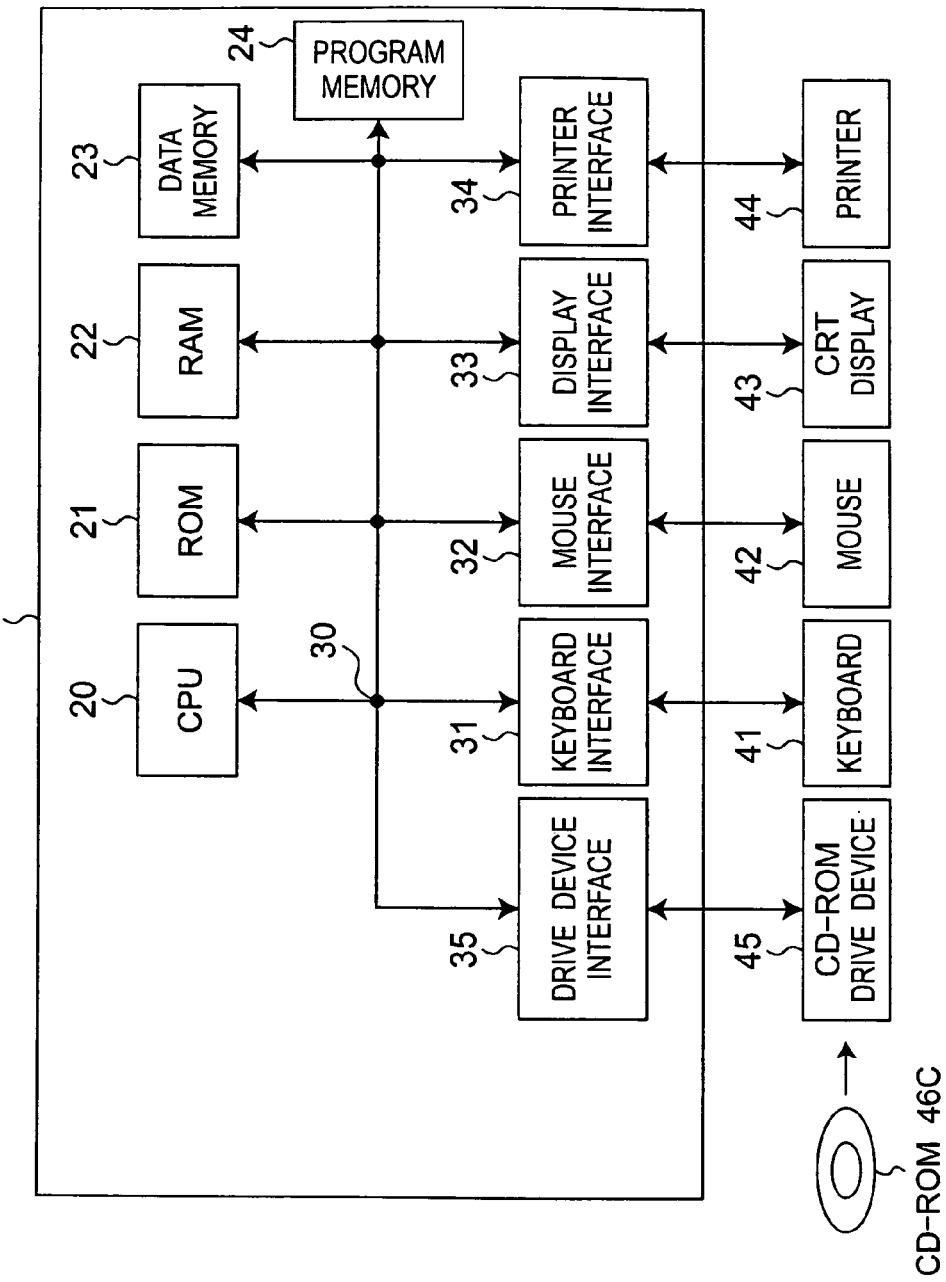
FIG. 12 is a block diagram showing a configuration of a fault diagnosis apparatus 100C according to a fourth preferred embodiment of the present invention.

FIG. 12 is a block diagram showing a configuration of a fault diagnosis apparatus 100C according to a fourth preferred embodiment of the present invention. In the fourth preferred embodiment, the fault diagnosis apparatus 100C conducting a fault diagnosis on a DUT 50 using the dynamic fault model (according to the first preferred embodiment) in consideration of the dynamic interferences of adjacent signal lines based on the following information is proposed:

(a) Information 61 on a fault test set, a fail test set, and a pass test set (sets of test pattern signals of respective tests) for the DUT 50;

(b) Information 62 on layout information, manufacturing parameter information, and timing information on the DUT 50; and (c) Information 63 on a netlist (data expressing circuit connection states) in the DUT 50. The fault diagnosis apparatus 100C shown in FIG. 12 is configured to include a fault diagnosis controller 10C and similar in configuration to the fault tester apparatus 100 shown in FIG. 1 except for the following points.

(1) A program for a fault diagnosis process (also referred to as a fault diagnosis process program hereinafter) shown in FIGS. 13 to 16 is stored in a program memory 24 and executed. Alternatively, the program for the fault diagnosis process shown in FIGS. 13 to 16 stored in a CD-ROM 46A may be stored in the program memory 24 via a drive device interface 35.

(2) The data (including the information 61, 62, and 63) required for executing the fault diagnosis process program is stored in a data memory 23 in advance.

(3) The fault tester apparatus 100 does not include a signal generator interface 36 and a signal detector interface 37.

First of all, definitions of terms related to the fault diagnosis apparatus 100C are given. In a fault test, if an error is observed in a primary output, the circuit is determined as a fault circuit. A fault diagnosis is executed on the fault circuit so as to point out a fault portion.

(A) Definition of Fail Test and Pass Test:

When a value of at least one of output responses differs from an expected value in the primary output signals from the DUT 50 to which test pattern signals of a test pair <tn, tn+1> are applied or in the output signals from a scan flip-flop, the test pattern signals of the test pair <tn, tn+1> are referred to as "fail tests (or test pattern signals of the fail tests)" for the DUT 50. Otherwise, the test pattern signals of the test pair <tn, tn+1> are referred to as "pass tests (or test pattern signals of the pass tests)" for the DUT 50. A fail test set is denoted by $T_{fail}$ and a pass test set is denoted by $T_{pass}$.

(B) Definition of Detection/Non-Detection Information

The detection/non-detection information obtained by the dynamic fault simulator apparatus 100B using the test pattern signals of the test pair <tn, tn+1> indicates whether or not a dynamic fault assumed by the test pattern signals of the test pair <tn, tn+1> can be detected.

(C) Definition of Fault Candidate:

A dynamic fault estimated to be present in the DUT 50 from fault test results (for example, the signal line 15 having the dynamic fault among the signal lines 11 to 19 shown in FIG. 2) is referred to as "fault candidate", and a fault candidate set is denoted by CFset.

The fault diagnosis program according to the present preferred embodiment is characterized by considering the influence of adjacent signal lines adjacent to a fault signal line in the dynamic fault model differently from the stuck-at fault model, the bridge fault model, and the delay fault model proposed so far. Accordingly, physical failures that are missed in the fault diagnosis method according to the prior arts can be diagnosed. The input information and output information related to the fault diagnosis program for the dynamic fault are as follows.

(A) Input Information:

The input information includes the layout information, the manufacturing process information, and the timing information on the DUT 50 obtained at design and manufacturing phases; a test set, and a fault set for diagnosis.

(B) Output Information:

The output information includes a fault candidate set and a fault candidate ranking list.

Figure 13:
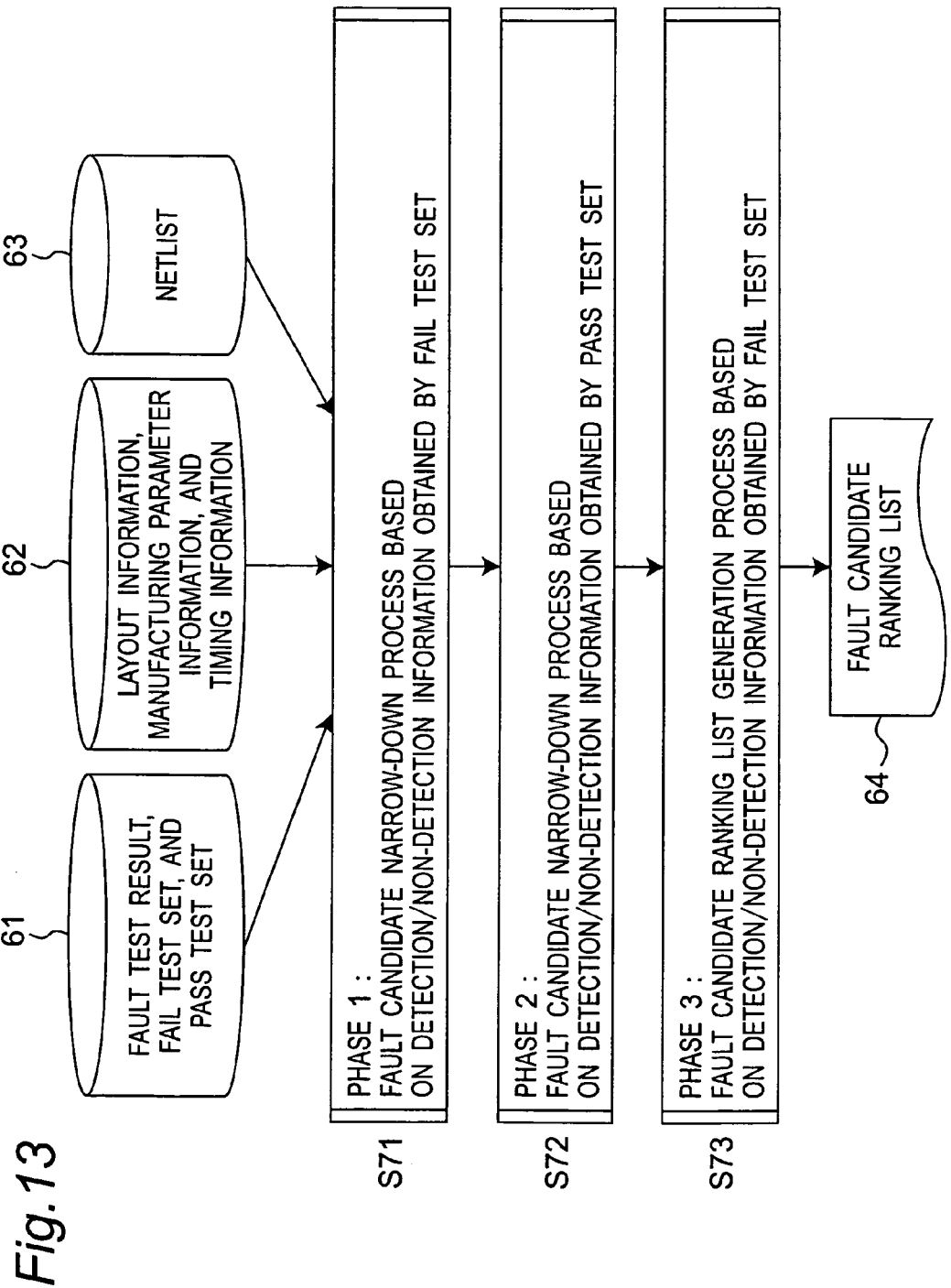
FIG. 13 is a flowchart showing a fault candidate ranking list generation and output process executed by a fault diagnosis controller 10C shown in FIG. 12.

FIG. 13 is a flowchart showing a fault candidate ranking list generation and output process executed by the fault tester and test generator controller 10C shown in FIG. 12. The fault diagnosis program for the dynamic fault according to the present preferred embodiment is configured to include the following three phases.

(1) Step S71: Phase 1 (a fault candidate narrow-down process based on the detection/non-detection information as obtained by the fail test set $T_{fail}$): Obtain detection/non-detection information on a dynamic fault in an output signal from each gate using the test pair <tn, tn+1>∈$T_{fail}$, and add a fault estimated to be present in the DUT 50 based on the results to the fault candidate set CFset.

(2) Step S72: Phase 2 (a fault candidate narrow-down process based on the detection/non-detection information as obtained by the pass test set $T_{pass}$): Obtain detection/non-detection information on dynamic faults using the test pair <tn, tn+1>∈$T_{fail}$ for fault candidates obtained by the process in the phase 1, and exclude faults estimated not to be present in the DUT 50 from the fault candidate set CFset based on the result.

(3) Step S73: Phase 3 (a fault candidate ranking list generation process based on the detection/non-detection information as obtained by the fail test set $T_{fail}$): Obtain the number of times of detection of faults using the detection/non-detection information on the dynamic faults for the fault candidates obtained by the process in the phase 2. Rearrange the fault candidates in descending order based on the number of times of detection and rank the fault candidates.

Figure 14:
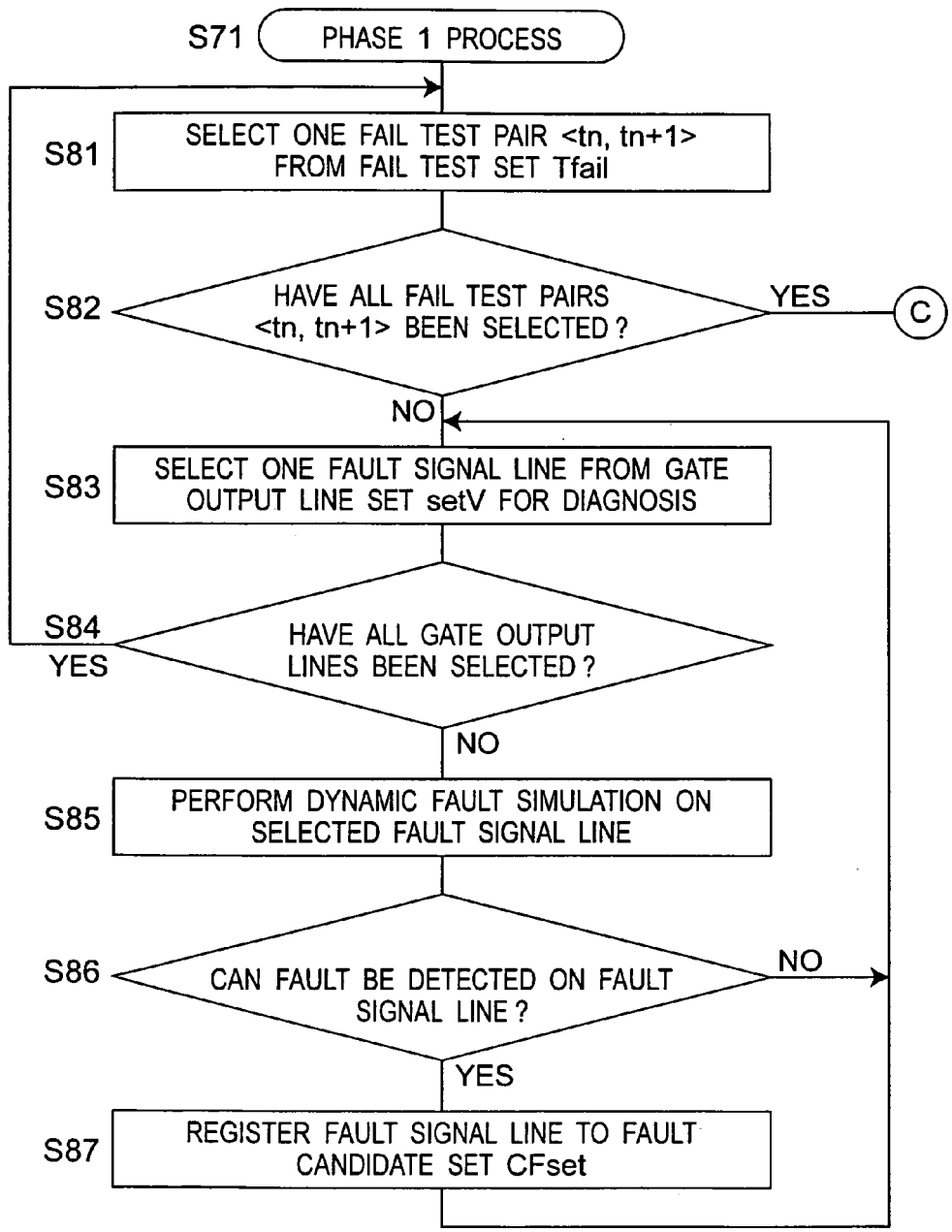
FIG. 14 is a flowchart showing a process (step S71) in phase 1 shown in FIG. 13.

FIG. 14 is a flowchart showing the process (step S71) in the phase 1 shown in FIG. 13. The process in the phase 1 (the fault candidate narrow-down process from the fail test set $T_{fail}$ based on the detection/non-detection information) will first be described in detail. In this process; the following points are considered so as to reduce fault candidates using the detection/non-detection information obtained from the results of the dynamic fault simulator based on the fail test set $T_{fail}$.

Concept 1: In the test pair <tn, tn+1>∈$T_{fail}$, a dynamic fault that can be detected by the test pair <tn, tn+1> is possibly present in the circuit under test (DUT 50).

The diagnosis procedure in the phase 1 based on the concept 1 is as follows.

>Start the procedure.

>An initial value of the fault candidate set CFset is null. It is assumed that a target fault is a gate output line set setV.

<SS1> Perform the following processes from SS2 to SS4 on all the test pairs <tn, tn+1>∈$T_{fail}$.

<SS2> Perform the following processes from SS3 to SS4 on fault signal lines Vj∈setV that are not included in the fault candidate set CFset until no unselected fault signal lines are present in the gate output line set setV (for example, a set of output lines from the inverters 111 to 119 shown in FIG. 2).

<SS3> Perform a dynamic fault simulation on each fault signal line Vj.

<SS4> If a dynamic fault on the fault signal line Vj is detected on one of primary output signal lines, add this fault signal line Vj to the fault candidate set CFset.

>End the procedure.

A specific example of the process in the phase 1 of step S71 will be described below with reference to FIG. 14.

At step S81 shown in FIG. 14, the fault diagnosis controller 10C selects one fail test pair <tn, tn+1> from the fail test set $T_{fail}$. It is to be noted that the test pair <tn, tn+1> refers to the test pattern signals of the test pair <tn, tn+1> according to the present preferred embodiment. At step S82, the fault diagnosis controller 10C determines whether or not all fail test pairs <tn, tn+1> have been selected. If YES at step S82, the control flow goes to step S91 shown in FIG. 15. On the other hand, if NO at step S82, the control flow goes to step S83. At step S83, the fault diagnosis controller 10C selects one fault signal line from the gate output line set setV for diagnosis. At step S84, the fault diagnosis controller 10C determines whether or not all the gate output lines have been selected. If YES at step S84, the control flow returns to step S81. On the other hand, if NO at step S84, the control flow goes to step S85. At step S85, the fault diagnosis controller 10C performs a dynamic fault simulation according to the second preferred embodiment on the selected fault signal line. At step S86, the fault diagnosis controller 10C determines whether or not a fault can be detected on the fault signal line. If YES at step S86, the control flow goes to step S87. On the other hand, if NO at step S86, the control flow returns to step S83. At step S87, the fault diagnosis controller 10C registers the fault signal line to the fault candidate set CFset, and the control flow returns to step S83.

Figure 15:
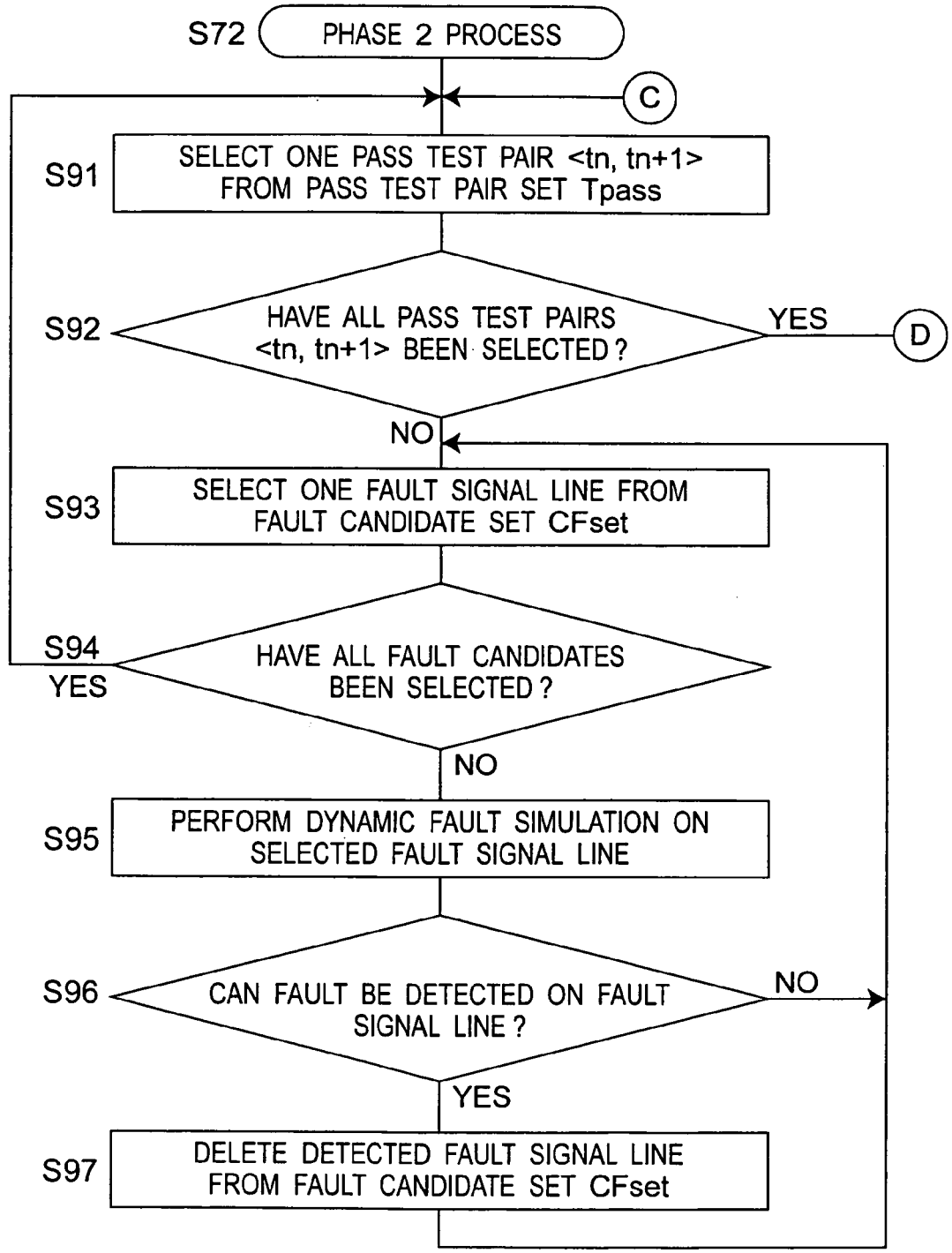
FIG. 15 is a flowchart showing a process (step S72) in phase 2 shown in FIG. 13.

FIG. 15 is a flowchart showing a process (step S72) in phase 2 shown in FIG. 13. In the process in the phase 2 (fault candidate narrow-down process from the pass test set $T_{pass}$ based on the detection/non-detection information), the following points are considered so as to reduce fault candidates using the detection/non-detection information obtained from the results of the dynamic fault simulator based on the pass test set $T_{pass}$.

Concept 2: In the test pair <tn, tn+1>∈$T_{pass}$, a dynamic fault that can be detected by the test pair <tn, tn+1> is not present in the circuit under test (DUT 50).

The diagnosis procedure in the phase 2 based on the concept 2 is as follows.

>Start the procedure.

>Define the fault candidates estimated in the phase 1 as the fault candidate set CFset.

<SS11> Perform the following processes from SS12 to SS14 on all the test pairs <tn, tn+1>∈$T_{pass}$.

<SS12> Select fault signal lines Vj∈CFset included in the CFset.

Repeat the processes from SS12 to SS14 until all the fault signal lines are selected.

<SS13> Perform the dynamic fault simulation according to the second preferred embodiment on each fault signal line Vj.

<SS14> If a fault signal value of the fault signal line Vj is detected in one of the primary output signal lines, exclude this fault signal line Vj from the fault candidate set CFset.

>End the procedure.

The process in the phase 2 shown in FIG. 15 will be described in detail. At step S91 shown in FIG. 15, the fault diagnosis controller 10C selects one pass test pair <tn, tn+1> from pass test pair set $T_{pass}$. At step S92, the fault diagnosis controller 10C determines whether or not all pass test pairs <tn, tn+1> have been selected. If YES at step S92, the control flow goes to step S101 shown in FIG. 10. On the other hand, if NO at step S92, the control flow goes to step S93. At step S93, the fault diagnosis controller 10C selects one fault signal line from fault candidate set CFset. At step S94, the fault diagnosis controller 10C determines whether or not all fault candidates have been selected. If YES at step S94, the control flow returns to step S91. On the other hand, if NO at step S94, the control flow goes to step S95. At step S95, the fault diagnosis controller 10C performs a dynamic fault simulation on the selected fault signal line. At step S96, the fault diagnosis controller 10C determines whether or not a fault can be detected on the fault signal line. If YES at step S96, the control flow goes to step S97. On the other hand, if NO at step S96, the control flow returns to step S93. At step S97, the fault diagnosis controller 10C deletes the detected fault signal lines from the fault candidate set CFset, and the control flow returns to step S93.

Figure 16:
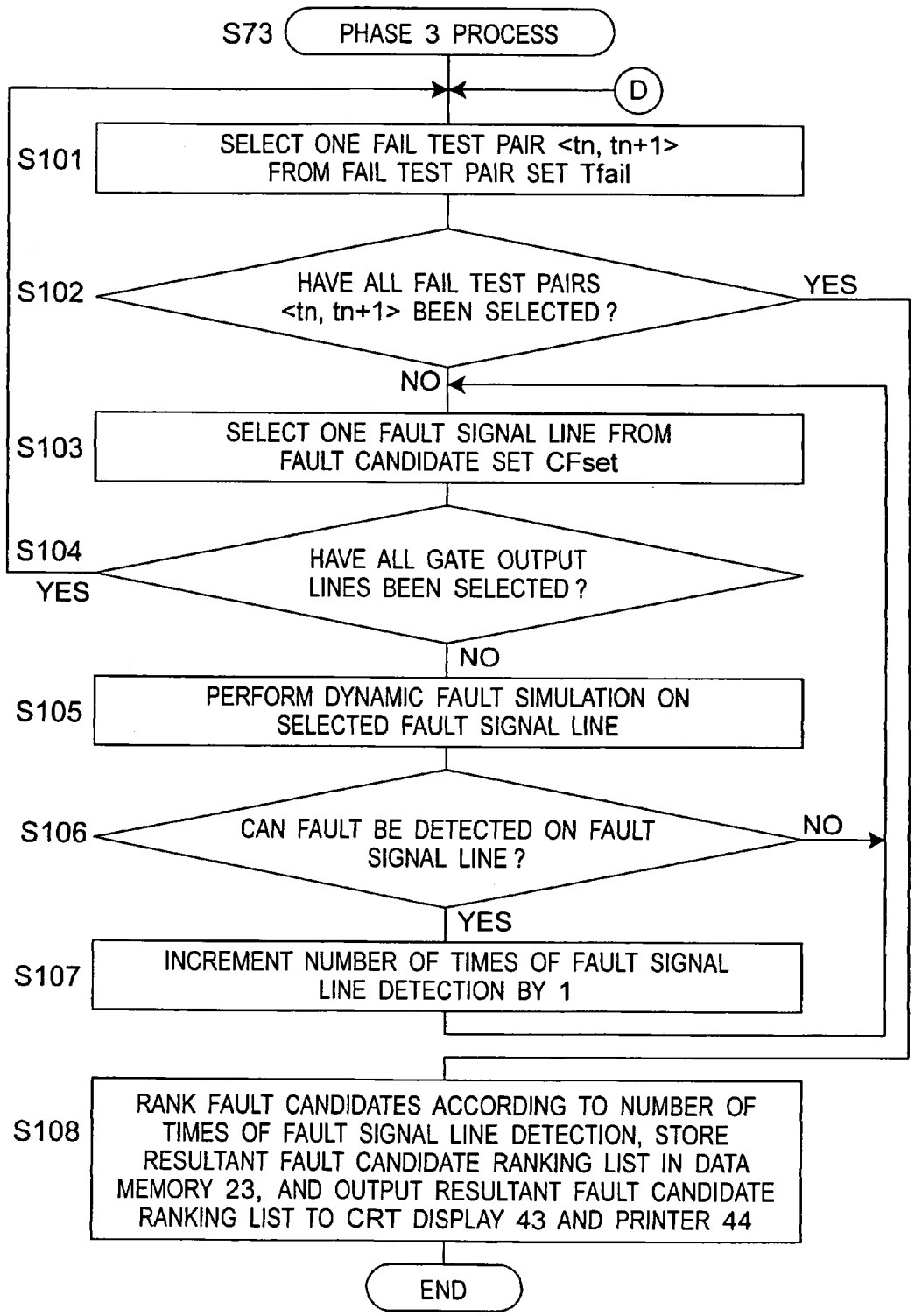
FIG. 16 is a flowchart showing a process (step S73) in phase 3 shown in FIG. 13.

FIG. 16 is a flowchart showing the process (step S73) in the phase 3 shown in FIG. 13. In the process in the phase 3 (the fault candidate ranking list generation process from the fail test set $T_{fail}$ based on the detection/non-detection information), the fault candidates are ranked using the detection/non-detection information obtained from the result of the dynamic fault simulation based on the fail test set $T_{fail}$. The following points are considered so as to reduce fault candidates based on this ranking.

Concept 3: An actual fault is included in the fault candidates higher in rank based on the number of times of detection for the test pair <tn, tn+1>∈$T_{fail}$.

The diagnosis procedure in the phase 3 based on the concept 3 is as follows.
>Start the procedure.
>Define the fault candidates estimated in the process in the phase 2 as the fault candidate set CFset.
>Initialize the number of times of detection of all the fault candidates in the fault candidate set CFset to 0.
<SS21> Perform the processes from SS22 to SS24 on all the test pairs <tn, tn+1>∈$T_{fail}$.
<SS22> Select fault signal lines Vj from the fault candidate set CFset. Repeat the processes from SS23 to SS24 until no undetected fault signal lines are present.
<SS23> Perform the dynamic fault simulation according to the second preferred embodiment on each fault signal line Vj.
<SS24> If a fault signal value of the fault signal line Vj is detected in one of the primary output signal lines, increment the number of times of detection of this fault signal line Vj by one.
<SS25> Rearrange the fault candidates in descending order based on the numbers of times of detection of the fault candidates. Obtain a list set of fault candidates given ranks.
>End the procedure.

The process in the phase 3 shown in FIG. 16 will be described in detail. At step S101 shown in FIG. 16, the fault diagnosis controller 10C selects one fail test pair <tn, tn+1> from the fail test pair set $T_{fail}$. At step S102, the fault diagnosis controller 10C determines whether or not all fail test pairs <tn, tn+1> have been selected. If YES at step S102, the control flow goes to step S108. On the other hand, if NO at step S102, the control flow goes to step S103. At step S103, the fault diagnosis controller 10C selects one fault signal line from the fault candidate set CFset. At step S104, the fault diagnosis controller 10C determines whether or not all gate output lines have been selected. If YES at step S104, the control flow returns to step S101. On the other hand, if NO at step S104, the control flow goes to step S105. At step S105, the fault diagnosis controller 10C performs a dynamic fault simulation on the selected fault signal line. At step S106, the fault diagnosis controller 10C determines whether or not a fault can be detected on the fault signal line. If YES at step S106, the control flow goes to step S107. On the other hand, if NO at step S106, the control flow returns to step S103. At step S107, the fault diagnosis controller 10C increments the number of times of the fault signal line detection by one, and then, the control flow returns to step S103. At step S108, the fault diagnosis controller 10C ranks the fault candidates according to the number of times of fault signal line detection, stores the resultant fault candidate ranking list in the data memory 23, and outputs the resultant fault candidate ranking list to a CRT display 43 and a printer 44. Then, the process is completed.

As stated so far, according to the present preferred embodiment, the dynamic fault simulation according to the second preferred embodiment is performed on the fail test set $T_{fail}$, and the dynamic fault simulation according to the second preferred embodiment is performed on the pass test set $T_{pass}$, this leads to making it possible to accurately perform a fault candidate narrow-down process and to obtain information on the fault candidates. Further, by rearranging the fault candidates in descending order based on the numbers of times of dynamic fault detection of the respective fault signal lines, the list set of fault candidates given ranks can be obtained. In the present preferred embodiment, the fault excitation function EX (LI, PI, TI) is calculated using the dynamic fault model according to the first preferred embodiment, and the dynamic fault simulations of faults generated due to the influence of the dynamic interferences of adjacent signal lines are performed based on the calculated fault excitation function EX (LI, PI, TI). Therefore, as compared with the test generation methods according to the prior arts, the fault simulation can be performed with higher accuracy and the fault candidates can be narrowed down with higher accuracy.

In the fourth preferred embodiment described so far, step S S71 to S73 are executed as shown in FIG. 13. However, the present invention is not limited to this. Only the processes of steps S71 and S72 may be executed.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

INDUSTRIAL APPLICABILITY

According to the fault test apparatus and the fault test method according to the present invention, the logic value change on the fault signal line caused by the dynamic interference of the adjacent signal line can be dealt with in a more actual form by means of the dynamic fault model using the circuit layout information and the timing information in the circuit under test. The fault excitation function EX (LI, PI, TI) is calculated using the dynamic fault model shown in FIG. 2, and the fault signal line caused by the dynamic interference of the adjacent signal line is detected based on the calculated fault excitation function EX (LI, PI, TI). Therefore, it is possible to detect a fault that may possibly be missed in the fault test methods according to the prior arts, perform the fault test with higher accuracy, and remarkably improve the fault detection ratio. Moreover, the fault test and diagnosis can be executed to the next-generation LSI chip at the minimum cost. Besides, the fault test process can be automated and accelerated, so that the development of DFM (Design For Manufacture) technique for LSI chip production can be considerably promoted.

What is claimed is:

1. A fault test apparatus for testing a fault on each signal line in a circuit under test including a plurality of signal lines, the fault test apparatus comprising:
a controller for calculating a value of a fault excitation function for a fault signal line, using the fault excitation function representing a fitness result of a predetermined fault excitation condition between the fault signal line having a fault among the signal lines under test in the circuit under test and at least one of adjacent signal lines adjacent to the fault signal line and falling within a predetermined range from the fault signal line, based on layout information between the fault signal line and at least one adjacent signal line adjacent to the fault signal line, manufacturing parameter information, and timing information, and for determining whether or not a dynamic fault is excited on the fault signal line based on the value of the fault excitation function.

2. The fault test apparatus as claimed in claim 1,
wherein the fault excitation function is represented by a product of the following:
(a) a first factor based on a condition as to whether or not a parallel distance between the fault signal line and at least one adjacent signal line is equal to or larger than a predetermined first threshold value;
(b) a second factor based on a condition as to whether or not a wiring width ratio of the fault signal line to at least one adjacent signal line is equal to or larger than a predetermined second threshold value;
(c) a third factor based on a condition as to whether or not an interval from a signal transition timing of the fault signal line to a signal transition timing of at least one adjacent signal line is included in a predetermined timing window;
(d) a fourth factor based on a condition as to whether or not a signal transition on the fault signal line and a signal transition on at least one adjacent signal line are identical in a direction of a change in a sign of the signal transition with each other; and
(e) a fifth factor based on an inter-wiring layer distance between the fault signal line and at least one adjacent signal line and an insulating material of inter-wiring layers.

3. The fault test apparatus as claimed in claim 1,
wherein the controller calculates a sum of values of fault excitation functions between the fault signal line and the respective adjacent signal lines, divides the calculated sum by number of the adjacent signal lines to calculate an average value of the fault excitation functions, and determines whether or not the dynamic fault is excited on the fault signal line based on whether or not the calculated average value of the fault excitation functions is equal to or larger than a predetermined third threshold value.

4. The fault test apparatus as claimed in claim 1,
wherein the controller performs a fault-free circuit logic simulation in the circuit under test for each test pair in a test pair set including a plurality of predetermined test intervals, obtains a signal line on which an influence of complementary values to logic values obtained by the fault-free circuit logic simulation propagates to a primary output, determines whether or not the dynamic fault is excited on the fault signal line using the fault excitation function with the obtained signal line assumed as the fault signal line, and outputs a determination result.

5. The fault test apparatus as claimed in claim 1,
wherein the controller selects a transition fault test pair in which the dynamic fault of the fault signal line is undetected in the circuit under test using each test pair in the test pair set including the plurality of predetermined test intervals, obtains a test pair for the transition fault on the signal line, extracts a logic value of Don't Care assigned in allocation of primary inputs so as to guarantee the transition fault in the selected signal line, performs a back tracing process from each of the adjacent signal lines including the Don't Care toward a primary input, and allocates a signal value for exciting the dynamic fault using the fault excitation function to the primary input including the Don't Care, thereby generating test pattern signals of the test pair.

6. The fault test apparatus as claimed in claim 1,
wherein the controller generates a fault candidate signal line set by performing the following:
(A) a first narrow-down process of determining whether or not the dynamic fault is excited on the fault signal line using the fault excitation function with each of the signal lines for a predetermined diagnosis assumed as the fault signal line using each fail test pair in a fail test set for the circuit under test, thereby narrowing down the fault signal line on which the dynamic fault is excited as a fault candidate signal line; and
(B) a second narrow-down process of determining whether or not the dynamic fault is exited on the fault signal line using the fault excitation function with respect to the fault candidate signal lines using each pass test pair in a pass test set for the circuit under test, thereby excluding the fault signal line on which the dynamic fault is excited from the fault candidate signal lines.

7. The fault test apparatus as claimed in claim 6,
wherein the controller further (C) generates and outputs a fault candidate ranking list according to number of times of fault signal line detection for the fault candidate signal line set after the second narrow-down process.

8. A fault test method for testing a fault on each signal line in a circuit under test including a plurality of signal lines, the fault test method including:
a control step of calculating a value of a fault excitation function for a fault signal line, using the fault excitation function representing a fitness result of a predetermined fault excitation condition between the fault signal line having a fault among the signal lines under test in the circuit under test and at least one of adjacent signal lines adjacent to the fault signal line and falling within a predetermined range from the fault signal line, based on layout information between the fault signal line and at least one adjacent signal line adjacent to the fault signal line, manufacturing parameter information, and timing information, and then, determining whether or not a dynamic fault is excited on the fault signal line based on the value of the fault excitation function.

9. The fault test method as claimed in claim 8,
wherein the fault excitation function is represented by a product of the following:
(a) a first factor based on a condition as to whether or not a parallel distance between the fault signal line and at least one adjacent signal line is equal to or larger than a predetermined first threshold value;

(b) a second factor based on a condition as to whether or not a wiring width ratio of the fault signal line to at least one adjacent signal line is equal to or larger than a predetermined second threshold value;

(c) a third factor based on a condition as to whether or not an interval from a signal transition timing of the fault signal line to a signal transition timing of at least one adjacent signal line is included in a predetermined timing window;

(d) a fourth factor based on a condition as to whether or not a signal transition on the fault signal line and a signal transition on at least one adjacent signal line are identical in a direction of a change in a sign of the signal transition with each other; and (e) a fifth factor based on an inter-wiring layer distance between the fault signal line and at least one adjacent signal line and an insulating material of inter-wiring layers.

10. The fault test method as claimed in claim 8, wherein the control step includes a step of calculating a sum of values of fault excitation functions between the fault signal line and the respective adjacent signal lines, dividing the calculated sum by number of the adjacent signal lines to calculate an average value of the fault excitation functions, and determining whether or not the dynamic fault is excited on the fault signal line based on whether or not the calculated average value of the fault excitation functions is equal to or larger than a predetermined third threshold value.

11. The fault test method as claimed in claim 8, wherein the control step includes a step of performing a fault-free circuit logic simulation in the circuit under test for each test pair in a test pair set including a plurality of predetermined test intervals, obtaining a signal line on which an influence of complementary values to logic values obtained by the fault-free circuit logic simulation propagates to a primary output, determining whether or not the dynamic fault is excited on the fault signal line using the fault excitation function with the obtained signal line assumed as the fault signal line, and outputting a determination result.

12. The fault test method as claimed in claim 8, wherein the control step includes a step of selecting a transition fault test pair in which the dynamic fault of the fault signal line is undetected in the circuit under test using each test pair in the test pair set including the plurality of predetermined test intervals, obtaining a test pair for the transition fault on the signal line, extracting a logic value of Don't Care assigned in allocation of primary inputs so as to guarantee the transition fault in the selected signal line, performing a back tracing process from each of the adjacent signal lines including the Don't Care toward a primary input, and allocating a signal value for exciting the dynamic fault using the fault excitation function to the primary input including the Don't Care, thereby generating test pattern signals of the test pair.

13. The fault test method as claimed in claim 8, wherein the control step includes a step of generating a fault candidate signal line set by performing the following:

(A) a first narrow-down process of determining whether or not the dynamic fault is excited on the fault signal line using the fault excitation function with each of the signal lines for a predetermined diagnosis assumed as the fault signal line using each fail test pair in a fail test set for the circuit under test, thereby narrowing down the fault signal line on which the dynamic fault is excited as a fault candidate signal line; and (B) a second narrow-down process of determining whether or not the dynamic fault is exited on the fault signal line using the fault excitation function with respect to the fault candidate signal lines using each pass test pair in a pass test set for the circuit under test, thereby excluding the fault signal line on which the dynamic fault is excited from the fault candidate signal lines.

14. The fault test method as claimed in claim 13, wherein the control step further includes a step of (C) generating and outputting a fault candidate ranking list according to number of times of fault signal line detection for the fault candidate signal line set after the second narrow-down process.

* * * * *